United States Patent
Saito et al.

(10) Patent No.: US 11,543,697 B2
(45) Date of Patent: Jan. 3, 2023

(54) POLARIZER AND IMAGE DISPLAY DEVICE

(71) Applicant: FUJIFILM Corporation, Tokyo (JP)

(72) Inventors: Kengo Saito, Kanagawa (JP); Yuzo Fujiki, Kanagawa (JP); Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 9 days.

(21) Appl. No.: 17/130,610

(22) Filed: Dec. 22, 2020

(65) Prior Publication Data

US 2021/0149247 A1    May 20, 2021

Related U.S. Application Data

(63) Continuation of application No. PCT/JP2019/022341, filed on Jun. 5, 2019.

(30) Foreign Application Priority Data

Jun. 27, 2018  (JP) .............................. JP2018-122261

(51) Int. Cl.
- *G02F 1/1335* (2006.01)
- *G02F 1/1337* (2006.01)
- *G02B 5/30* (2006.01)

(52) U.S. Cl.
CPC ..... *G02F 1/133531* (2021.01); *G02B 5/3016* (2013.01); *G02F 1/1337* (2013.01); *C09K 2323/031* (2020.08); *C09K 2323/035* (2020.08)

(58) Field of Classification Search
CPC ............ G02F 1/133531; G02B 5/3016; C09K 2323/031
See application file for complete search history.

(56) References Cited

U.S. PATENT DOCUMENTS

| | | | |
|---|---|---|---|
| 5,310,837 A * | 5/1994 | May ................... | C09K 19/3852 526/311 |
| 2011/0177315 A1* | 7/2011 | Iwahashi ................ | G02B 5/223 534/754 |

(Continued)

FOREIGN PATENT DOCUMENTS

| JP | 2011-237513 A | 11/2011 |
|---|---|---|
| JP | 2016-027387 A | 2/2016 |

(Continued)

OTHER PUBLICATIONS

Notice of Reasons for Refusal issued by the Japanese Patent Office dated Feb. 8, 2022, in connection with Japanese Patent Application No. 2020-527334.

(Continued)

*Primary Examiner* — Sophie Hon
(74) *Attorney, Agent, or Firm* — Edwards Neils LLC; Jean C. Edwards, Esq.

(57) ABSTRACT

Provided are a polarizer having a high degree of alignment and an image display device including the polarizer. The polarizer of the present invention is a polarizer which is formed of a polarizer-forming composition containing a liquid crystal compound and a dichroic material, in which the liquid crystal compound and the dichroic material are horizontally aligned, and in an X-ray diffraction spectrum of the polarizer, at least one of a plurality of peaks observed in a diffraction angle range of 17° or less is a peak A in which an interval of a periodic structure corresponding to the at least one peak does not have an integer multiple relationship with an interval of a periodic structure corresponding to at least one of other peaks.

17 Claims, 4 Drawing Sheets

(56) References Cited

U.S. PATENT DOCUMENTS

| | | | |
|---|---|---|---|
| 2013/0070899 A1 | 3/2013 | Morishima et al. | |
| 2015/0337203 A1* | 11/2015 | Hida .................. | G02B 5/305 252/299.1 |
| 2015/0378068 A1 | 12/2015 | Hatanaka | |
| 2019/0001619 A1 | 1/2019 | Mizumura et al. | |
| 2019/0101676 A1 | 4/2019 | Katou et al. | |
| 2020/0319507 A1 | 10/2020 | Matsuyama et al. | |

FOREIGN PATENT DOCUMENTS

| | | |
|---|---|---|
| JP | 2018-045210 A | 3/2018 |
| WO | 2017/154835 A1 | 9/2017 |
| WO | 2017/170036 A1 | 10/2017 |
| WO | 2019/132020 A1 | 7/2019 |

OTHER PUBLICATIONS

Notice of Reasons for Refusal issued by the Japanese Patent Office dated Oct. 5, 2021, in connection with Japanese Patent Application No. 2020-527334.

International Search Report issued in PCT/JP2019/022341 dated Aug. 13, 2019.

Written Opinion issued in PCT/JP2019/022341 dated Aug. 13, 2019.

International Preliminary Report on Patentability completed by WIPO on Dec. 29, 2020 in connection with International Patent Application No. PCT/JP2019/022341.

Notice of Reasons for Refusal issued by the Japanese Patent Office dated Aug. 30, 2022, in connection with Japanese Patent Application No. 2020-527334.

* cited by examiner

POLARIZER AND IMAGE DISPLAY DEVICE

CROSS-REFERENCE TO RELATED APPLICATIONS

This application is a Continuation of PCT International Application No. PCT/JP2019/022341 filed on Jun. 5, 2019, which was published under PCT Article 21(2) in Japanese, and which claims priority under 35 U.S.C. § 119(a) to Japanese Patent Application No. 2018-122261 filed on Jun. 27, 2018. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic dye in place of iodine as a dichroic material has also been examined.

For example, JP2011-237513A discloses a light absorption anisotropic film which contains a polymer liquid crystal compound and a dichroic material.

SUMMARY OF THE INVENTION

As a result of preparation of a polarizer with reference to the examples of JP2011-237513A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

In order to solve the above-described problem, the present invention has the following configurations.

[1] A polarizer which is formed of a polarizer-forming composition containing a liquid crystal compound and a dichroic material, in which the liquid crystal compound and the dichroic material are horizontally aligned, and in an X-ray diffraction spectrum of the polarizer, at least one of a plurality of peaks observed in a diffraction angle range of 17° or less is a peak A in which an interval of a periodic structure corresponding to the at least one peak does not have an integer multiple relationship with an interval of a periodic structure corresponding to at least one of other peaks.

[2] The polarizer according to [1], in which a half-width of a peak in $\varphi$ scan for the periodic structure corresponding to the at least one peak A is 30° or less.

[3] The polarizer according to [1] or [2], in which the half-width of the peak in $\varphi$ scan for the periodic structure corresponding to the at least one peak A is in a range of 3° to 23°.

[4] The polarizer according to any one of [1] to [3], in which the polarizer-forming composition exhibits only nematic liquid crystallinity.

[5] The polarizer according to any one of [1] to [4], in which the peak A is observed in a direction outside of a range of +5° of a direction orthogonal to a direction of an alignment axis along which the liquid crystal compound and the dichroic material are aligned.

[6] An image display device comprising: the polarizer according to any one of [1] to [5].

As described below, according to the present invention, it is possible to provide a polarizer with a high degree of alignment and an image display device including the polarizer.

DESCRIPTION OF THE PREFERRED EMBODIMENTS

Figure 1:
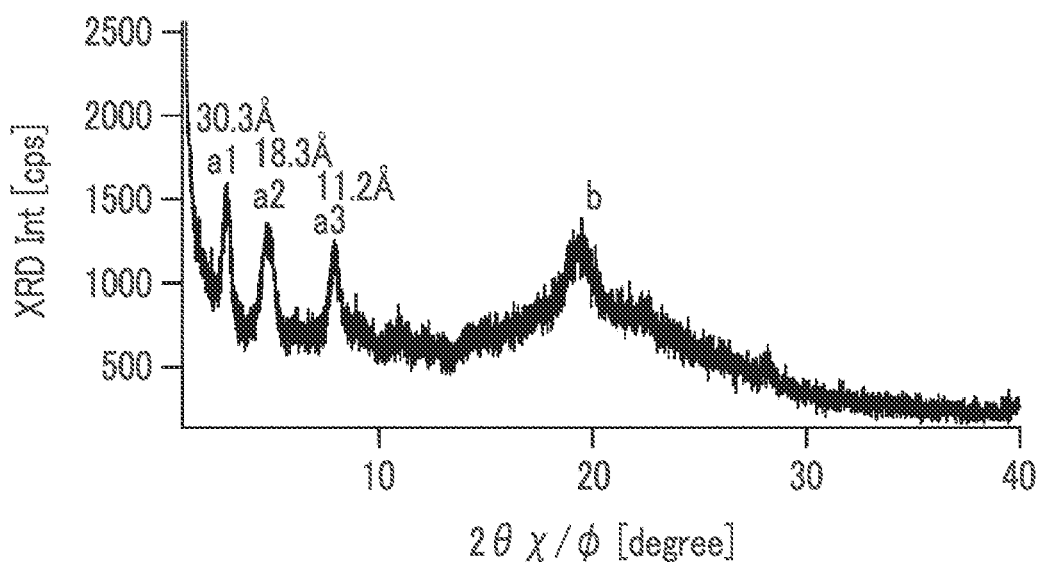
FIG. 1 is a graph showing an X-ray diffraction (XRD) spectrum corresponding to a polarizer according to an embodiment of the present invention.

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Moreover, materials corresponding to respective components may be used alone or in combination of two or more kinds thereof as the respective components. Here, in a case where two or more kinds of respective components are used in combination, the content of the components indicates the total content of the combined components unless otherwise specified.

Further, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

A polarizer according to the embodiment of the present invention is a polarizer which is formed of a polarizer-forming composition containing a liquid crystal compound and a dichroic material, in which the polarizer-forming composition is horizontally aligned, and in an X-ray diffraction spectrum of the polarizer, at least one of a plurality of peaks observed in a diffraction angle range of 17° or less is a peak A in which an interval of a periodic structure corresponding to the one peak does not have an integer multiple relationship with an interval of a periodic structure corresponding to at least one of other peaks.

In the X-ray diffraction (XRD) spectrum, the expression of "having a peak A in which the interval of the corresponding periodic structure does not have an integer multiple relationship with an interval of a periodic structure of another peak" means that a nematic component and a crystal component are present in the polarizer.

Here, the "nematic component" in the polarizer indicates a region where a part of the polarizer-forming composition is fixed in a state of a nematic phase, and the "crystal component" indicates a region where a part of the polarizer-forming composition is fixed in a state of a crystal phase.

A nematic component and a crystal component are present in the polarizer according to the embodiment of the present invention. A polarizer with a high degree of alignment can be obtained due to the simultaneous presence of the nematic component and the crystal component. The reason for this is assumed as follows.

It is generally known that a higher-order phase (for example, a smectic phase or a crystal phase) than a nematic phase has a high degree of alignment. In a case of such a higher-order phase, since the size of the domain is increased, haze is likely to occur and the degree of alignment decreases in an actual film. On the contrary, in a case where the polarizer is configured such that a nematic component and a crystal component are mixed, haze can be suppressed, and a high degree of alignment can be achieved by using a high-order crystal phase.

Since a nematic phase does not have a periodic structure, the periodicity is not generally observed. Further, a broad peak (halo) generated due to an average intermolecular distance is observed in the XRD spectrum (see FIG. 2 described below).

Meanwhile, a layer structure is usually formed in a case of a higher-order phase such as a smectic phase, and thus a peak having a length of the layer (also referred to as an interval or period length of a periodic structure) is observed in the XRD spectrum.

Here, in a case of a polarizer having only a smectic component, a peak corresponding to an interval of a periodic structure of a smectic phase and a peak corresponding to a higher-order component thereof are observed in the XRD spectrum. Therefore, the interval of a periodic structure calculated from a diffraction angle at which each peak is observed has an integer multiple relationship with an interval of any of other peaks. Therefore, the peak A in which the interval of the periodic structure does not have an integer multiple relationship with the interval of a periodic structure corresponding to another peak is not observed.

Meanwhile, since the periodicity of atoms increases in the crystal component, peaks other than the peak corresponding to the length of the layer are generally observed.

Therefore, in the X-ray diffraction (XRD) spectrum, in the polarizer according to the embodiment of the present invention which has a peak A in which the interval of the corresponding periodic structure does not have an integer multiple relationship with the interval of a periodic structure of another peak, a nematic component and a crystal component are present in the polarizer.

The XRD spectrum of the polarizer is measured using the in-plane method.

Hereinafter, the X-ray diffraction analysis performed using an in-plane method is also described as "in-plane XRD". The in-plane XRD is performed by irradiating the surface of the polarizer layer with X-rays using a thin film X-ray diffractometer under the following conditions.

(Conditions)

Cu ray source to be used (CuKα, output of 45 kV, 200 mA)

X-ray incidence angle of 0.2°

Optical system to be used: parallel optical system (cross beam optics (CBO)) (parallel beam (PB))

incident side, incident slit having a width of 0.2 mm, incident parallel slit in-plane parallel slit collimator (PSC) at 0.5 degrees (deg), longitudinal limit slit having a width of 10 mm Light-receiving side, light-receiving slit having a width of 20 mm, light-receiving parallel slit in-plane parallel slit analyzer (PSA) at 0.5 deg Detector: HyPix3000 (OD mode) manufactured by Rigaku Corporation 2θχ/φ Scan, scan conditions: 0.008 degrees/step, 2.0 degrees/min in a range of 1 to 40 degrees φ Scan, scan conditions: 0.5 degree/step, 9.6 degree/min in a range of −120 to 120 degrees The above-described conditions are set values in the thin film X-ray diffractometer. A known device can be used as the thin film X-ray diffractometer. As an example of the thin film X-ray diffractometer, SmartLab (manufactured by Rigaku Corporation) can be exemplified.

A sample is disposed such that a direction in which the liquid crystal compound and the dichroic material are aligned in a major axis direction on the device is parallel to the incident X-ray (alignment axis direction). The azimuthal angle (φ) here is set to 0°.

The alignment axis direction is measured as follows.

In-plane XRD (2θχ/φ scan) is performed such that the periodic structure in the alignment axis direction is observed. The direction orthogonal to the orientation in the substrate plane where the peak intensity is the maximum is set as a direction of the alignment axis by φ scan performed on the observed peak at every 0.5°.

In-plane XRD (2θχ/φ scan) was performed at every 0.5° in an azimuthal angle (φ) range of 0° to 90°, and thus the orientation in the substrate plane where the peak intensity is the maximum is determined by φ scan performed on the observed peak. The XRD spectrum is acquired by performing in-plane XRD (2θχ/φ scan) in the orientation in which the peak intensity is maximum.

The interval of the periodic structure is calculated from the observed peak using the following equation.

$$d=\lambda/(2\times\sin\theta)$$

Here, d represents the distance (the interval of a periodic structure), X represents the incident X-ray wavelength (CuKα; 1.54 Å), and θ represents the diffraction angle.

For the peak intensity, a value standardized as a film thickness corresponding to the X-ray penetration length at an X-ray incidence angle of 0.2° is used. Further, the diffraction angle θ is a diffraction angle 2θχ/φ in 2θχ/φ scan of the in-plane XRD.

Hereinafter, the description will be made in more detail based on the XRD spectrum.

FIG. 1 is a graph showing an X-ray diffraction spectrum of a polarizer in the example of the present invention.

Peaks a1 to a3 are peaks that are present in a diffraction angle range of 17° or less. In a case where a distance d is calculated from the diffraction angle θ of each peak, d corresponding to the peak a1 is 30.3 Å, d corresponding to the peak a2 is 18.3 Å, and d corresponding to the peak a3 is 11.2 Å.

The distances d corresponding to each of the peaks a1 to a3 do not have an integer multiple relationship with each other. Therefore, all the peaks a1 to a3 correspond to the peak A. These peaks are considered to be peaks derived from a crystal component.

Further, in the XRD spectrum shown in FIG. 1, the peak b that is present in the vicinity of a diffraction angle of 20° is considered to be a peak (halo) derived from the nematic phase.

Figure 3:
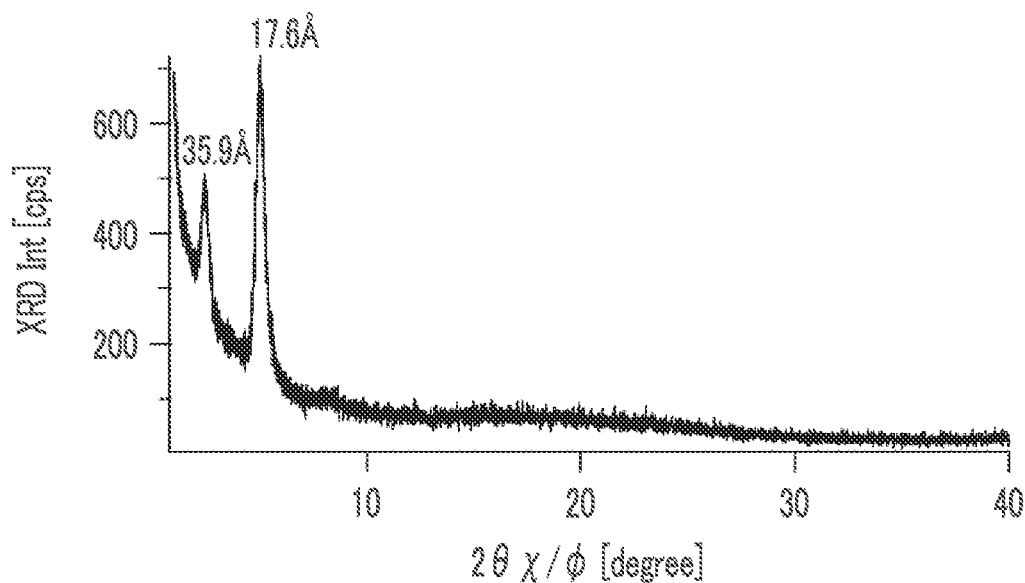
FIG. 3 is a graph showing an XRD spectrum corresponding to a polarizer of Comparative Example 2.

Further, two peaks are present in the XRD spectrum of the comparative example shown in FIG. 3, but the intervals of the periodic structures corresponding to the two peaks are respectively 35.9 Å and 17.6 Å, which have an integer multiple (twice) relationship with each other. The integer multiple relationship between the plurality of peaks is caused by the presence of only the smectic component.

Here, in a case where the peak top intensity is higher than the baseline intensity by 80 or greater in the XRD spectrum, this is regarded as a peak. The baseline intensity is defined by a known method.

Here, the unit of the peak intensity is count per second (cps).

Further, the peak intensity indicates a difference between the baseline intensity and the peak top intensity.

In the present invention, in a case where the intervals of the two periodic structures corresponding to two peaks are compared with each other, and the interval of the larger periodic structure is in a range of n×0.98 to n×1.02 (n represents an integer) of the interval of the smaller periodic structure, the intervals of the periodic structures between the peaks are considered to have an integer multiple relationship.

The peak A is limited to a diffraction angle of 17° or less.

The peak A is present preferably in a diffraction angle range of 1° to 17°, more preferably in a diffraction angle range of 1.5° to 7, and still more preferably in a diffraction angle range of 1.8° to 17°.

In the XRD spectrum shown in FIG. 1, the intervals of all the peaks a1 to a3 corresponding to the peak A do not have an integer multiple relationship with the intervals of the periodic structures of all the other peaks. However, the present invention is not limited thereto as long as the interval of the peak A has an integer multiple relationship with an interval of a periodic structure of at least one of other peaks.

Further, in the XRD spectrum shown in FIG. 1, all the peaks observed in a diffraction angle range of 17° or less corresponded to the peak A. However, the present invention is not limited thereto as long as at least one of the peaks observed in a diffraction angle range of 17° or less correspond to the peak A.

Further, from the viewpoint of further improving the degree of alignment, the half-width of a peak in the φ scan for the periodic structure corresponding to at least one peak A is preferably 30° or less, more preferably in a range of 3 to 23, and still more preferably in a range of 3° to 20°.

As is well known, the result of the φ scan shows the directions of measured periodic structures that exist and the degree of distribution thereof. Therefore, as the half-width of a peak decreases, the measured periodic structures are present in the same direction, which means that the degree of alignment is high.

The half-width of the peak may be acquired by fitting the observed peak to the gauss function.

Hereinafter, the description will be made in more details based on the results of the 9 scan of the example.

Figure 4:
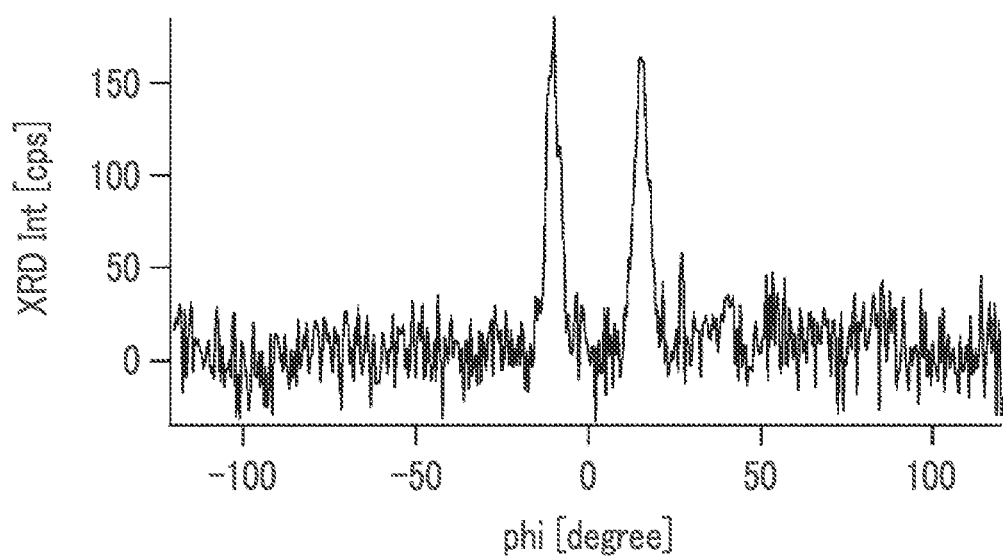
FIG. 4 is a graph showing $\varphi$ scan corresponding to a polarizer according to an embodiment of the present invention.

FIG. 4 is a graph showing the results of φ scanning performed on the periodic structure corresponding to one of the peaks A observed in the XRD spectrum in the example of the polarizer according to the embodiment of the present invention. In the graph shown in FIG. 4, the horizontal axis is set as the azimuthal angle φ, and the alignment axis direction is set to 0°.

In FIG. 4, the peak observed at a position of approximately 10° corresponds to the target peak A. The half-width of this peak is fitted to the gauss function, and the acquired value is approximately 3°.

Further, the peak observed at a position of approximately −10° is a peak derived from the same periodic structure as the periodic structure corresponding to the peak observed at a position of approximately 10°. As described above, the peak derived from a certain periodic structure is observed at a symmetrical position with respect to an azimuthal angle of 0°.

Further, the half-width of the peak in the φ scan for the periodic structure corresponding to at least one peak A may be 30° or less, and it is preferable that all the half-widths of the peaks in the φ scan for the periodic structures corresponding to the peak As are 30° or less.

In the present invention, it is preferable that the peak A is observed in a direction outside of a range of ±5° of a direction orthogonal to a direction of an alignment axis along which the liquid crystal compound and the dichroic material are aligned. That is, it is preferable that the peak A is observed in a range where the azimuthal angle φ is ±85°.

[Polarizer-Forming Composition]

The polarizer-forming composition used in the polarizer according to the embodiment of the present invention (hereinafter, also referred to as the "composition of the present invention") contains a liquid crystal compound and a dichroic material.

The composition of the present invention may contain components other than the liquid crystal compound and the dichroic material, such as a polymerization initiator, a solvent, and an interface modifier.

Further, it is preferable that the composition of the present invention exhibits only the nematic properties.

Hereinafter, each component will be described.

<Liquid Crystal Compound>

As described above, the composition of the present invention has a liquid crystal compound. As the liquid crystal compound, any of a low-molecular-weight liquid crystal compound or a polymer liquid crystal compound can be used. Here, the "low-molecular-weight liquid crystal compound" indicates a liquid crystal compound having no repeating unit in the chemical structure. Further, the "polymer liquid crystal compound" indicates a liquid crystal compound having a repeating unit in the chemical structure. Examples of the low-molecular-weight liquid crystal compound include compounds described in JP2013-228706A. Further, examples of the polymer liquid crystal compound include compounds described in JP2011-237513A. The liquid crystal compound is a thermotropic liquid crystal and may exhibit any of a nematic phase or a smectic phase, but it is preferable that the liquid crystal compound exhibits at least the nematic phase. The temperature at which the nematic phase is exhibited is preferably in a range of room temperature (23° C.) to 450° C., and more preferably in a range of 50° C. to 400° C. from the viewpoints of handleability and manufacturing suitability.

Further, examples of the polymer liquid crystal compound include the following thermotropic liquid crystals and polymer liquid crystal compounds that are crystalline polymers (hereinafter, also referred to as "specific compounds").

(Thermotropic Liquid Crystal)

A thermotropic liquid crystal is a liquid crystal that shows transition to a liquid crystal phase due to a change in temperature.

The specific compound is a thermotropic liquid crystal and may exhibit any of a nematic phase or a smectic phase, but it is preferable that the specific compound exhibits at least the nematic phase from the viewpoint that the degree of alignment of the polarizer is further increased, and haze is unlikely to be observed (haze is improved). Hereinafter, "the degree of alignment of the polarizer is further increased, and haze is unlikely to be observed" will be also referred to as "the effects of the present invention are more excellent".

(Crystalline Polymer)

A crystalline polymer is a polymer showing a transition to a crystal layer due to a change in temperature. The crystalline polymer may show a glass transition other than the transition to the crystal layer.

From the viewpoint that the effects of the present invention are more excellent, it is preferable that the specific compound is a polymer liquid crystal compound that shows a transition (may show a glass transition during the process) from a crystal phase to a liquid crystal phase in a case of being heated or a polymer liquid crystal compound that shows a transition (may show a glass transition during the process) to a crystal phase in a case of being heated to enter a liquid crystal state and then being cooled down.

The presence or absence of crystallinity of the polymer liquid crystal compound is evaluated as follows.

Two polarizers of an optical microscope (ECLIPSE E600 POL, manufactured by Nikon Corporation) are disposed so as to be orthogonal to each other, and a sample table is set between the two polarizers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum.

As a result, in a case where an exothermic peak is observed at a temperature other than the liquid crystal phase transition temperature, it can be said that the exothermic peak is a peak due to crystallization and the polymer liquid crystal compound has crystallinity.

Meanwhile, in a case where an exothermic peak is not observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound that has a repeating unit (1) described below is preferable, and a method of using a suitable embodiment among polymer liquid crystal compounds having a repeating unit (1) described below is more preferable.

(Crystallization Temperature)

As described above, the specific compound is a crystallized polymer.

From the viewpoint that the effects of the present invention are more excellent, the crystallization temperature of the specific compound is preferably 0° C. or higher and lower than 150° C., more preferably 120° C. or lower, still more preferably 15° C. or higher and lower than 120° C., and particularly preferably 95° C. or lower. The crystallization temperature of the polymer liquid crystal compound is preferably lower than 150° C. from the viewpoint of reducing haze.

Further, the crystallization temperature is a temperature of an exothermic peak due to crystallization in the above-described DSC.

(Suitable Embodiment)

From the viewpoint that the effects of the present invention are more excellent, it is preferable that the specific compound is a polymer liquid crystal compound having a repeating unit represented by Formula (1) (hereinafter, also referred to as a "repeating unit (1)").

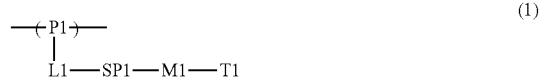

(1)

In Formula (1), P1 represents a main chain of the repeating unit, L1 represents a single bond or a divalent linking group, SP1 represents a spacer group, M1 represents a mesogen group, and T1 represents a terminal group.

Specific examples of the main chain of the repeating unit represented by P include groups represented by Formulae (P1-A) to (P1-D). Among these, from the viewpoints of diversity and handleability of a monomer serving as a raw material, a group represented by Formula (P1-A) is preferable.

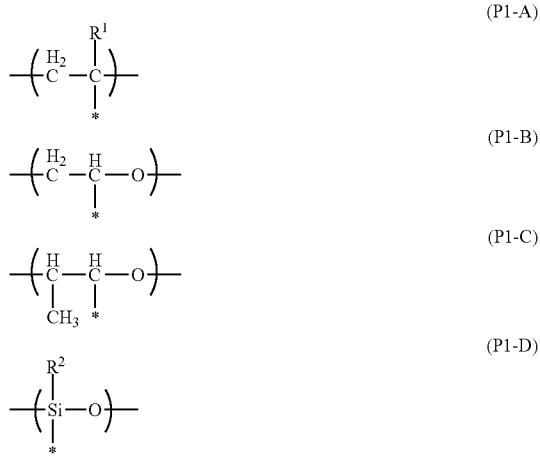

(P1-A)
(P1-B)
(P1-C)
(P1-D)

In Formulae (P-A) to (P1-D), "*" represents a bonding position with respect to L1 in Formula (1). In Formula (P1-A), $R^1$ represents a hydrogen atom or a methyl group. In Formula (P1-D), $R^2$ represents an alkyl group.

From the viewpoint that the effects of the present invention are more excellent, it is preferable that the group represented by Formula (P1-A) is a unit of a partial structure of poly(meth)acrylic acid ester obtained by polymerization of (meth)acrylic acid ester.

From the viewpoint that the effects of the present invention are more excellent, it is preferable that the group represented by Formula (P1-B) is an ethylene glycol unit in polyethylene glycol obtained by polymerizing ethylene glycol.

From the viewpoint that the effects of the present invention are more excellent, it is preferable that the group represented by Formula (P1-C) is a propylene glycol unit obtained by polymerizing propylene glycol.

From the viewpoint that the effects of the present invention are more excellent, it is preferable that the group represented by Formula (P1-D) is preferably a siloxane unit of a polysiloxane obtained by polycondensation of a silanol.

L1 represents a single bond or a divalent linking group. Examples of the divalent linking group represented by L1 include —C(O)O—, —OC(O)—, —O—, —S—, —C(O)NR$^3$—, —NRC(O)—, —SO$_2$—, and —NR$^3$R$^4$—. In the formulae, $R^3$ and $R^4$ each independently represent a hydrogen atom or an alkyl group having 1 to 6 carbon atoms which may have a substituent (for example, a substituent W described below).

In a case where P1 represents a group represented by Formula (P1-A), from the viewpoint that the effects of the present invention are more excellent, it is preferable that L represents a group represented by —C(O)O—.

In a case where P1 represents a group represented by any of Formulae (P1-B) to (P1-D), from the viewpoint that the effects of the present invention are more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (1). From the viewpoint that the effects of the present invention are more excellent, n1 represents preferably an integer of 2 to 10, more preferably an integer of 2 to 4, and most preferably 3.

Further, from the viewpoint that the effects of the present invention are more excellent, a group represented by *—(CH(CH$_3$)—CH$_2$O)$_{n2}$—* is preferable as the oxypropylene structure represented by SP1. In the formula, n2 represents an integer of 1 to 3, and "*" represents a bonding position with respect to L1 or M1.

Further, from the viewpoint that the effects of the present invention are more excellent, a group represented by *—(Si(CH$_3$)$_2$—O)$_{n3}$—* is preferable as the polysiloxane structure represented by SPL. In the formula, n3 represents an integer of 6 to 10, and "*" represents a bonding position with respect to L1 or M1.

Further, from the viewpoint that the effects of the present invention are more excellent, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, the description on pages 7 to 16 of "FlussigeKristalle in Tabellen II" (VEB Deutsche Verlag fur Grundstoff Industrie, Leipzig, 1984) and the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

(M1-A)

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent such as a substituent W described below.

The divalent group represented by A1 is preferably a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA represents a divalent linking group. In a case where a2 represents 2 or greater, a plurality of LA's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z'')—, —N(Z'')—C(O)—C(Z)=C(Z')—, —C(Z)=C(Z')—C(O)—, —S—C(O)—C(Z)=C(Z')—, —C(Z)=N—N=C(Z')—(Z, Z', and Z'' each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

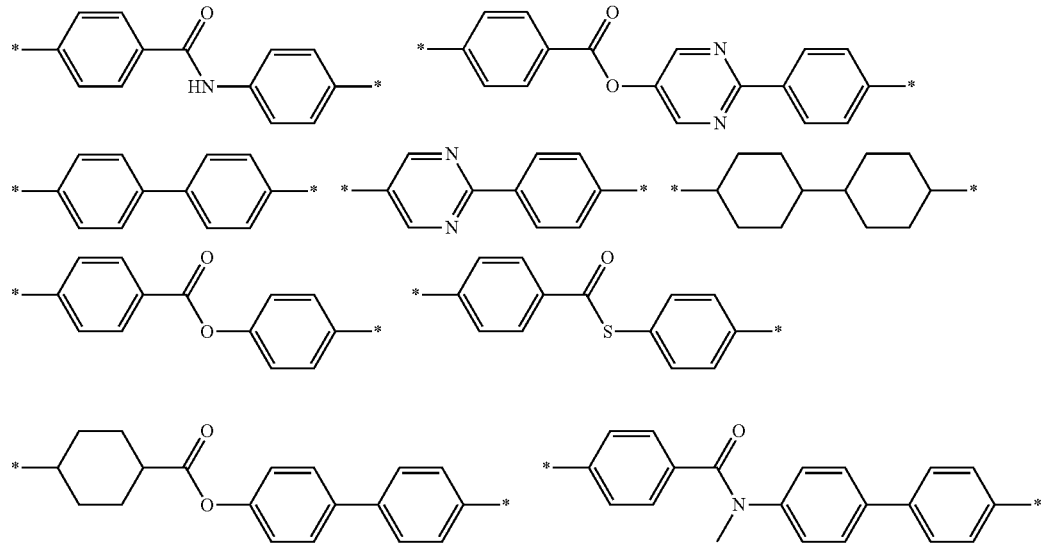

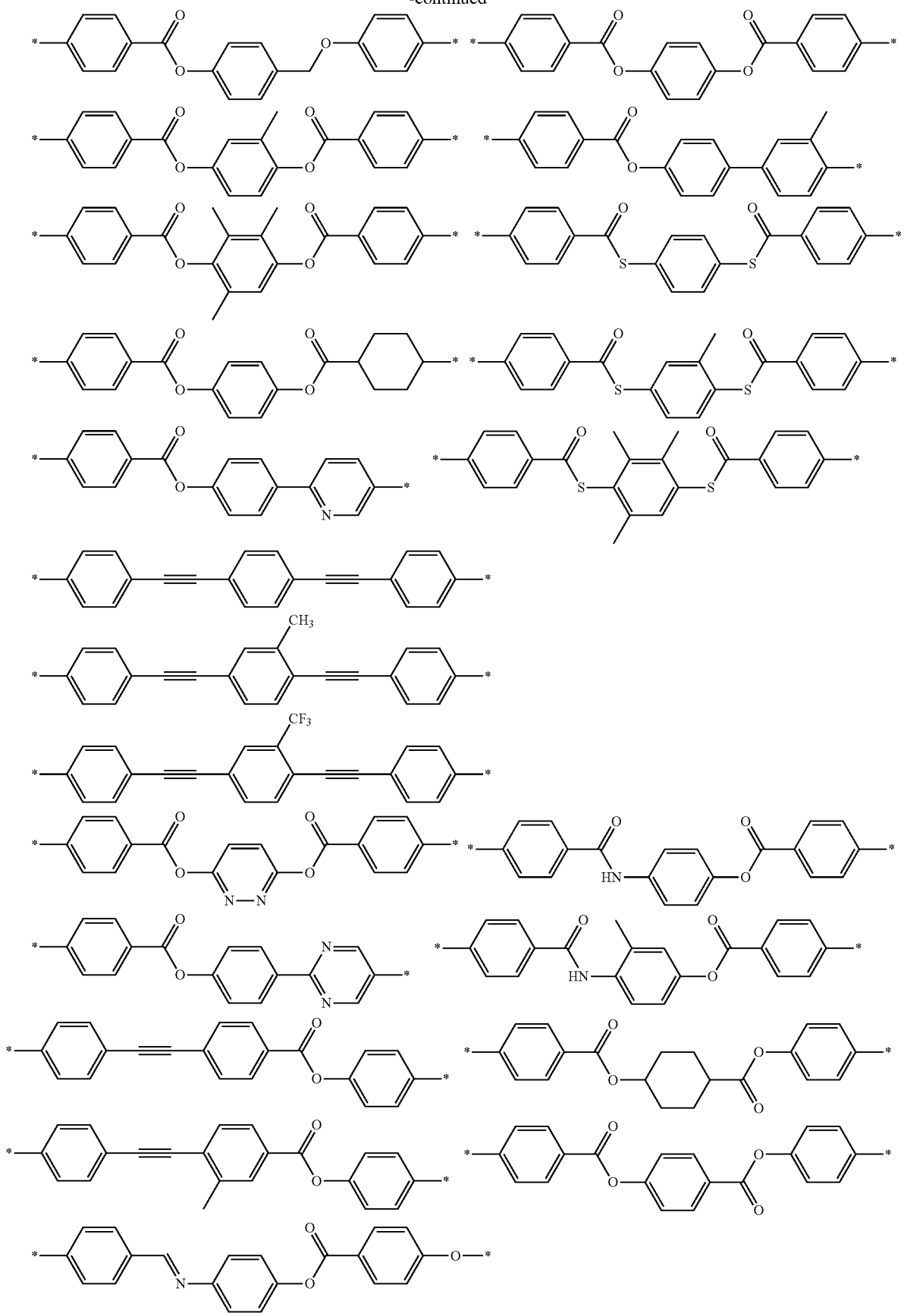

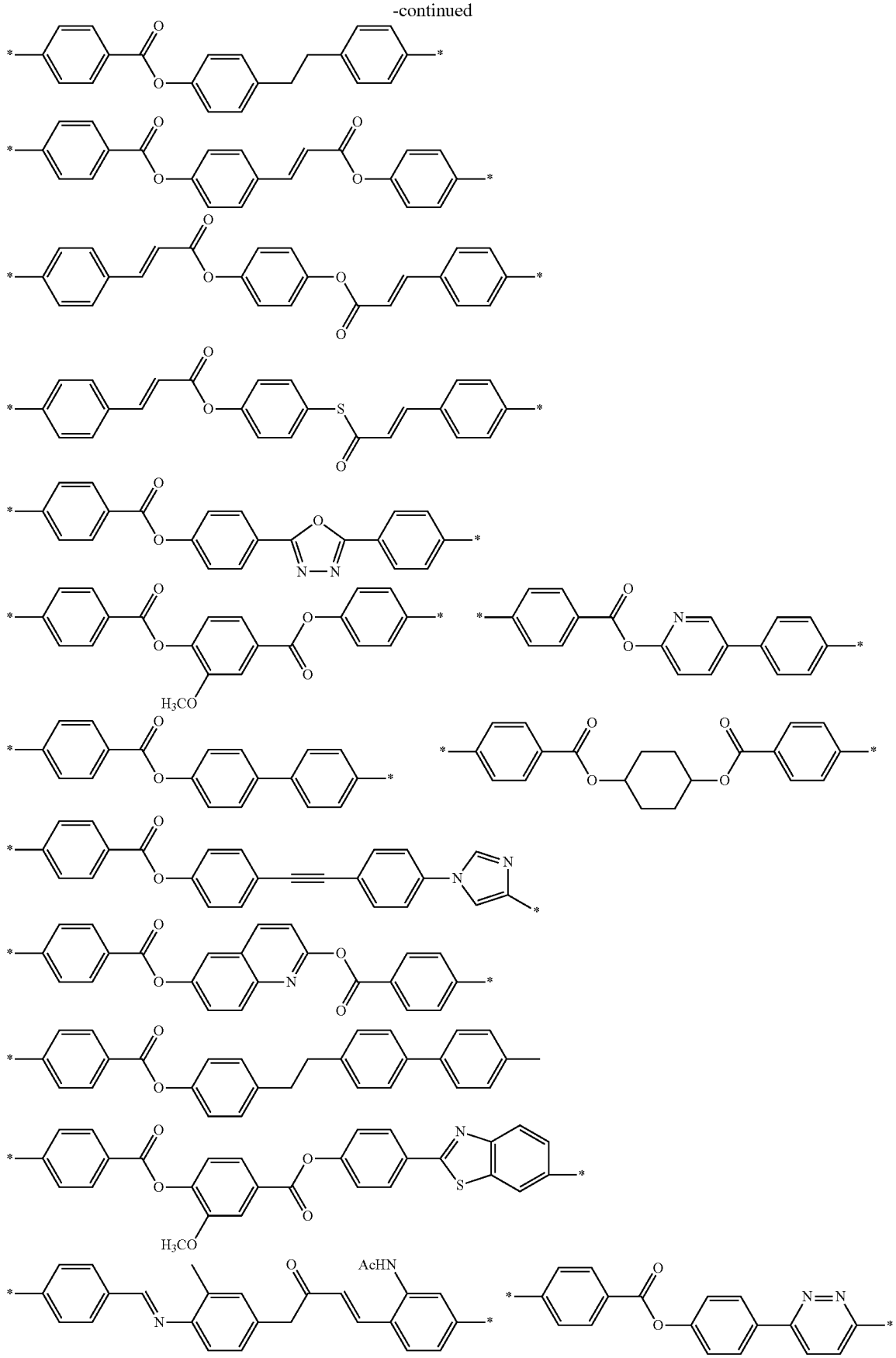

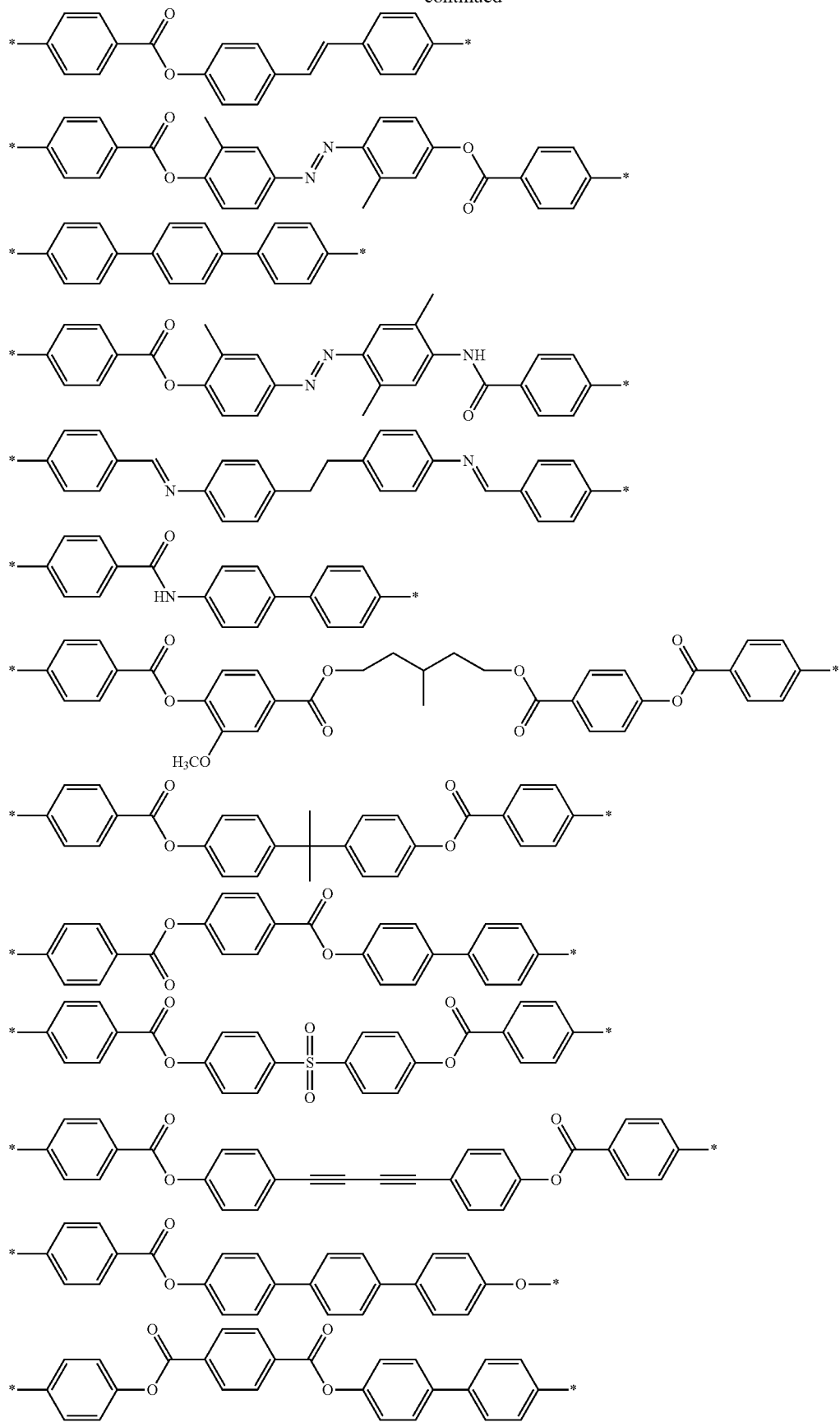

-continued

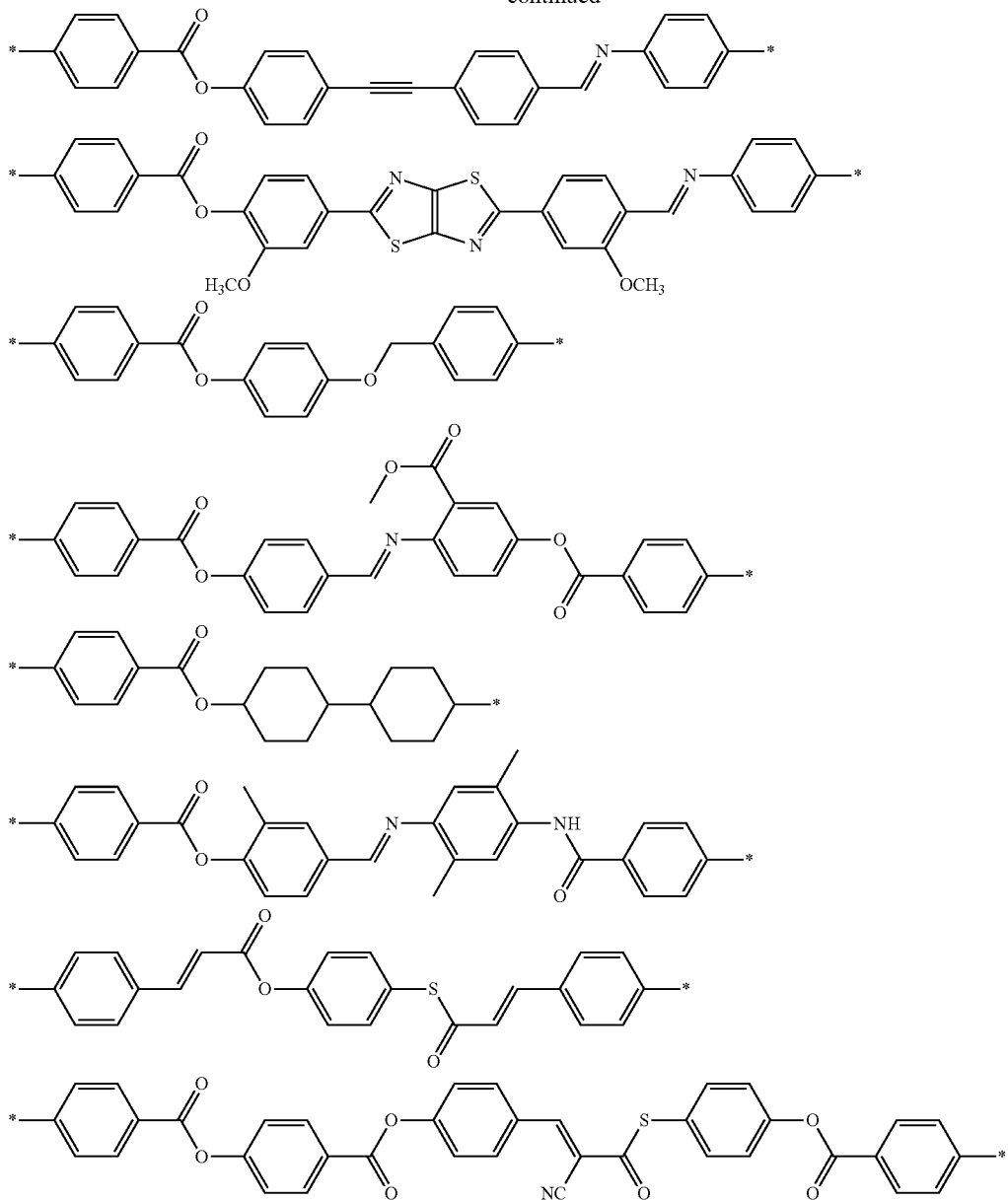

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the effects of the present invention are more excellent, the content of the repeating unit (1) is preferably in a range of 20% to 100% by mass, more preferably in a range of 30% to 99.9% by mass, and still more preferably in a range of 40% to 99.0% by mass with respect to 100% by mass of all the repeating units in the specific compound.

In the present invention, the content of each repeating unit contained in the polymer liquid crystal compound is calculated based on the charged amount (mass) of each monomer used for obtaining each repeating unit.

The specific compound may have only one or two or more kinds of the repeating units (1). Among these, from the viewpoint that the effects of the present invention are more excellent, the specific compound may have two kinds of the repeating units (1).

In a case where the specific compound has two kinds of the repeating units (1), from the viewpoint that the effects of the present invention are more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention are more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention are more excellent, the ratio (A/B) of the content of the repeating unit A in the specific compound to the content of the repeating unit B in the specific compound is preferably in a range of 50/50 to 95/5, more preferably in a range of 60/40 to 93/7, and still more preferably in a range of 70/30 to 90/10.

(Weight-Average Molecular Weight)

In a case where the liquid crystal compound is a polymer liquid crystal compound, from the viewpoint that the effects of the present invention are more excellent, the weight-average molecular weight (Mw) thereof is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) thereof is preferably in a range of 10000 to 300000.

Further, from the viewpoint of the temperature latitude of the degree of alignment, the weight-average molecular weight (Mw) thereof is preferably in a range of 2000 to 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

<Dichroic Material>

The dichroic material is not particularly limited, and examples thereof include a visible light absorbing material (dichroic dye), a light emitting material (such as a fluorescent material or a phosphorescent material), an ultraviolet absorbing material, an infrared absorbing material, a non-linear optical material, a carbon nanotube, and an inorganic material (for example, a quantum rod). Further, known dichroic materials (dichroic dyes) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [J0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0022] to [0080] of JP2015-001425, paragraphs [0005] to [0051] of JP2016-006502, paragraphs [0005] to [0041] of WO2016/060173A, paragraphs [0008] to [0062] of WO2016/136561A, paragraphs [0014] to [0033] of JP2016-044909, paragraphs [0014] to [0033] of JP2016-044910, paragraphs [0013] to [0037] of JP2016-095907, and paragraphs [0014] to [0034] of JP2017-045296.

In the present invention, two or more kinds of dichroic materials may be used in combination. For example, from the viewpoint of making the color of the polarizer closer to black, it is preferable that at least one dichroic material having a maximum absorption wavelength in a wavelength range of 370 to 550 nm and at least one dichroic material having a maximum absorption wavelength in a wavelength range of 500 to 700 nm are used in combination.

The dichroic material may contain a crosslinkable group.

Specific examples of the crosslinkable group include a (meth)acryloyl group, an epoxy group, an oxetanyl group, and a styryl group. Among these, a (meth)acryloyl group is preferable.

In the composition of the present invention, from the viewpoint that the effects of the present invention are more excellent, the content of the dichroic material is preferably in a range of 1 to 400 parts by mass, more preferably in a range of 2 to 100 parts by mass, and still more preferably in a range of 5 to 30 parts by mass with respect to 100 parts by mass of the liquid crystal compound.

In a case where the composition of the present invention contains two kinds of dichroic materials, which are the first dichroic material and the second dichroic material, it is preferable that the first dichroic material is compatible with the liquid crystal compound and the second dichroic material is not compatible with the liquid crystal compound. As described above, the degree of alignment of the first dichroic material and the second dichroic material can be increased at the same time by controlling the compatibility of the first dichroic material and the second dichroic material with the liquid crystal compound.

The compatibility between the liquid crystal compound and the first dichroic material and the compatibility between the liquid crystal compound and the second dichroic material can be confirmed by the following method.

Two polarizers of an optical microscope (ECLIPSE E600 POL, manufactured by Nikon Corporation) are disposed so as to be orthogonal to each other, and a sample table is set between the two polarizers. A composition obtained by changing the mixing ratio of the liquid crystal compound and the dichroic material is cast on glass, and the glass is set on a hot stage placed on a sample table. The phase separation state of the sample is observed by raising and lowering the temperature of the hot stage in a range of higher than or equal to the melting point of the liquid crystal compound and the dichroic material and lower than or equal to the isotropic phase. In this operation, it is defined that the liquid crystal compound and the dichroic material are compatible with each other in a case where phase separation is not observed at an optional mixing ratio of the liquid crystal compound and the dichroic material. Further, it is defined that the liquid crystal compound and the dichroic material are incompatible with each other in a case where phase separation is observed at a certain mixing ratio of the liquid crystal compound and the dichroic material.

<Solvent>

From the viewpoint of workability and the like, it is preferable that the present composition of the present invention contains a solvent.

Examples of the solvent include ketones (such as acetone, 2-butanone, methyl isobutyl ketone, cyclopentanone, and cyclohexanone), ethers (such as dioxane, tetrahydrofuran, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, and butyl acetate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide and dimethylacetamide), organic solvents such as heterocyclic compounds (such as pyridine), and water. These solvents may be used alone or in combination of two or more kinds thereof.

Among these solvents, it is preferable to use an organic solvent and more preferable to use halogenated carbons or ketones from the viewpoint that the effects of the present invention are more excellent.

In a case where the composition of the present invention contains a solvent, from the viewpoint that the effects of the present invention are more excellent, the content of the solvent is preferably in a range of 70% to 99.5% by mass, more preferably in a range of 80% to 99% by mass, and still more preferably in a range of 85% to 97% by mass with respect to the total mass of the composition of the present invention.

<Interface Modifier>

From the viewpoint that the effects of the present invention are more excellent, it is preferable that the composition of the present invention contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow polymer liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the composition of the present invention contains an interface modifier, from the viewpoint that the effects of the present invention are more excellent, the content of the interface modifier is preferably in a range of 0.001 to 5 parts by mass and more preferably in a range of 0.01 to 3 parts by mass with respect to 100 parts by mass which is the total amount of the liquid crystal compound and the dichroic material in the composition.

<Polymerization Initiator>

From the viewpoint that the effects of the present invention are more excellent, it is preferable that the composition of the present invention contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. No. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. No. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the composition of the present invention contains a polymerization initiator, from the viewpoint that the effects of the present invention are more excellent, the content of the polymerization initiator is preferably in a range of 0.01 to 30 parts by mass and more preferably in a range of 0.1 to 15 parts by mass with respect to 100 parts by mass which is the total amount of the liquid crystal compound and the dichroic material in the composition. The durability of the polarizer is improved in a case where the content of the polymerization initiator is 0.01 parts by mass or greater, and the alignment of the polarizer is improved in a case where the content of the polymerization initiator is 30 parts by mass or less.

<Crystallization Temperature>

From the viewpoint that the effects of the present invention are more excellent, the crystallization temperature of the composition of the present invention is preferably in a range of 0° C. to 100° C. and more preferably in a range of 15° C. to 85° C. In a case where the crystallization temperature of the composition of the present invention is lower than 0° C., a low-temperature device is required to crystallize the composition of the present invention. In a case where the crystallization temperature of the composition of the present invention is higher than 110° C., haze is likely to occur.

The crystallization temperature of the composition of the present invention is measured according to the same procedures as those for the crystallization temperature of the polymer liquid crystal compound described above except that the composition of the present invention is used in place of the polymer liquid crystal compound. The crystallization temperature of the above-described composition is considered to be the crystallization temperature of mixed crystals of the polymer liquid crystal compound and the dichroic material.

<Substituent W>

The substituent in the present specification will be described.

Examples of the substituent W include a halogen atom, an alkyl group (such as a tert-butyl group) (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (also referred to as a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituents.

The details of the substituent are described in paragraph [0023] of JP2007-234651A.

[Horizontal Alignment]

As described above, in the polarizer according to the embodiment of the present invention, the liquid crystal compound and the dichroic material are horizontally aligned.

Here, the horizontal alignment indicates that the liquid crystal compound and the dichroic material are aligned to be parallel to the main surface of the polarizer, but these are not required to be strictly parallel, and the average tilt angle with the horizontal plane is less than ±10 degrees. Further, the tilt angle can be measured using AxoScan OPMF-1 (manufactured by Opto Science, Inc.).

Specifically, an extinction coefficient ko [λ] (in-plane direction) and an extinction coefficient ke [λ] (thickness direction) are calculated using AxoScan OPMF-1 (manufactured by Opto science, Inc.) by calculating the Mueller matrix of the polarizer at a wavelength λ and at room temperature based on the polar angle measured for every 10° from −50° to 50°, removing the influence of the surface reflection, and fitting the result to the following theoretical formula in consideration of the Snell's formula and Fresnel's equations. Unless otherwise specified, the wavelength λ is set to 550 nm.

$$k=-\log(T)\times\lambda/(4\pi d)$$

Here, T represents the transmittance, and d represents the thickness of the polarizer.

By calculating the absorbance and the dichroic ratio in the in-plane direction and the thickness direction based on the calculated ko [λ] and ke [λ], it can be confirmed whether the liquid crystal compound and the dichroic material are horizontally aligned.

[Thickness]

From the viewpoint that the effects of the present invention are more excellent, the film thickness of the polarizer according to the embodiment of the present invention is preferably in a range of 0.1 to 5.0 µm and more preferably in a range of 0.3 to 1.5 µm. Although it depends on the concentration of the dichroic material in the composition, a polarizer with an excellent absorbance is obtained in a case where the film thickness is 0.1 µm or greater, and a polarizer with an excellent transmittance is obtained in a case where the film thickness is 5.0 µm or less.

[Method of Producing Polarizer]

The method of producing the polarizer according to the embodiment of the present invention is not particularly limited, but a method comprising a step of coating an alignment film with the above-described composition of the present invention to form a coating film (hereinafter, also referred to as a "coating film forming step") and a step of aligning a dichroic material contained in the coating film (hereinafter, also referred to as an "aligning step") in this order (hereinafter, also referred to as the "method of the present invention") is preferable from the viewpoint that the degree of alignment of the polarizer to be obtained is further increased and the haze is unlikely to be observed. Hereinafter, "the degree of alignment of the polarizer to be obtained is increased and haze is unlikely to be observed" will also be referred to as "the effects of the present invention are more excellent".

Hereinafter, each step will be described.

<Coating Film Forming Step>

The coating film forming step is a step of coating the alignment film with the above-described composition of the present invention to form a coating film. The liquid crystal compound in the coating film is horizontally aligned due to an interaction between the alignment film and an interface modifier (in a case where the composition of the present invention contains an interface modifier).

The alignment film can be easily coated with the composition of the present invention by using the composition of the present invention which contains the above-described solvent or using a liquid such as a melt obtained by heating the composition of the present invention.

Examples of the method of coating the film with the composition of the present invention include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

An alignment film may be any film as long as the film allows the liquid crystal compound contained in the composition of the present invention to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as o-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0° to 90 (vertical) and more preferably in a range of 40° to 90°.

In a case where light to be applied is non-polarized light, the alignment film is irradiated with non-polarized light obliquely. The incidence angle is preferably in a range of 10° to 80°, more preferably in a range of 20° to 60°, and still more preferably in a range of 30° to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step, the dichroic material is considered to be aligned along the liquid crystal compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the composition of the present invention may be aligned by performing the above-described coating film forming step or drying treatment. For example, in an embodiment in which the composition of the present invention is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained is further increased.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling means is not particularly limited and can be performed according to a known method.

The polarizer according to the embodiment of the present invention can be obtained by performing the above-described steps.

<Other Steps>

The method of the present invention may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a $\lambda/4$ plate on the polarizer according to the embodiment of the present invention.

Further, the laminate of the present invention may include a barrier layer between the polarizer according to the embodiment of the present invention and the $\lambda/4$ plate.

Hereinafter, each layer constituting the laminate of the present invention will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence such as polycarbonate and polysulfone which has been known in the related art, a polymer with the exhibiting property which has been decreased by modifying the molecules described in WO2000/026705A can be used.

[Alignment Film]

The alignment film is as described above, and thus the description thereof will not be repeated.

[Polarizer]

The polarizer according to the embodiment of the present invention is as described above, and thus the description will not be repeated.

[$\lambda/4$ Plate]

A "$\lambda/4$ plate" is a plate having a $\lambda/4$ function, specifically, a plate having a function of converting linearly polarized light having a specific wavelength into circularly polarized light (or converting circularly polarized light into linearly polarized light).

For example, specific examples of a form in which a $\lambda/4$ plate has a single-layer structure include a stretched polymer film and a phase difference film in which an optically anisotropic layer having a $\lambda/4$ function is provided on a support. Further, specific examples of a form in which a $\lambda/4$ plate has a multilayer structure include a broadband $\lambda/4$ plate obtained by laminating a $\lambda/4$ plate and a $\lambda/2$ plate.

The $\lambda/4$ plate and the polarizer according to the embodiment of the present invention may be provided by coming into contact with each other, or another layer may be provided between the $\lambda/4$ plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the $\lambda/4$ plate. Further, in a case where a layer other than the barrier layer (for example, a pressure sensitive adhesive layer or an adhesive layer) is comprised between the polarizer according to the embodiment of the present invention and the $\lambda/4$ plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the $\lambda/4$ plate, the laminate can be used as a linear polarizing plate.

Meanwhile, in a case where the laminate of the present invention includes the $\lambda/4$ plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned at the time of no voltage application. The concept of the liquid crystal cell in a VA mode includes (1) a liquid crystal cell in a VA mode in a narrow sense where rod-like liquid crystalline molecules are aligned substantially vertically at the time of no voltage application and substantially horizontally at the time of voltage application (described in JP1990-176625A (JP-H02-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

[Synthesis Example]
[Liquid Crystal Compound]
<Liquid Crystal Compound L1>

A liquid crystal compound L1 was prepared according to the following procedures.

(Synthesis of Compound L1-2)

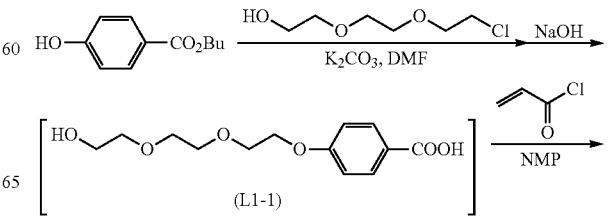

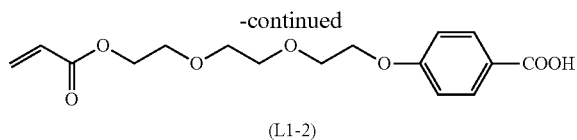

(L1-2)

2-Chloroethoxyethoxyethanol (244 g) and potassium carbonate (200 g) were added to a solution of butylparaben (201 g) in N,N-dimethylformamide (300 mL). The solution was stirred at 95° C. for 9 hours, toluene (262 mL) and water (660 mL) were added thereto, and concentrated hydrochloric acid (147 g) was added dropwise thereto. The reaction solution was stirred for 10 minutes, allowed to stand, and washed by performing a liquid separation operation. A 28 wt % (28 mass %) sodium methoxide methanol solution (500 g) and water (402 mL) were added to the obtained organic layer, and the solution was stirred at 50° C. for 2 hours. Thereafter, the organic solvent was distilled off by concentration, water (402 mL) was added thereto, and the solution was concentrated again at 50° C. until the weight thereof reached 1.13 kg. Water (478 mL) was added to the obtained solution, and concentrated hydrochloric acid (278 g) was added dropwise thereto. Ethyl acetate (1.45 kg) was added thereto, and the solution was stirred at 30° C. for 10 minutes, and the aqueous layer was removed by performing the liquid separation operation. Next, a 20 wt % sodium chloride solution (960 mL) was added thereto, the solution was stirred at 30° C. for 10 minutes, and the aqueous layer was removed by performing the liquid separation operation. N-methylpyrrolidone (824 g) was added to the obtained organic layer, and a concentration operation was performed thereon at 70° C. for 4 hours to obtain 1.13 kg of a N-methylpyrrolidone solution containing a compound (L1-1). The next step was performed using 1085 g of the obtained N-methylpyrrolidone solution containing the obtained compound (L1-1). N,N-dimethylaniline (189 g) and 2,2,6,6-tetramethylpiperazine (1.5 g) were added to the obtained N-methylpyrrolidone solution (1085 g) containing the obtained compound (L1-1), the internal temperature was lowered, and acrylic acid chloride (122 g) was added dropwise thereto such that the internal temperature did not rise above 10° C. The solution was stirred at an internal temperature of 10° C. for 2 hours, methanol (81 g) was added dropwise thereto, and the resulting solution was stirred for 30 minutes. Ethyl acetate (1.66 kg), 10 wt % sodium chloride solution (700 mL), and 1 N aqueous hydrochloric acid (840 mL) were added thereto, and the aqueous layer was removed by performing the liquid separation operation. Next, a 10 wt % sodium chloride solution (800 mL) was added thereto, the solution was stirred at 30° C. for 10 minutes, and the aqueous layer was removed by performing the liquid separation operation. Next, a 20 wt % sodium chloride solution (800 mL) was added thereto, the solution was stirred at 30° C. for 10 minutes, and the aqueous layer was removed by performing the liquid separation operation. A mixed solvent of hexane/isopropyl alcohol (1780 mL/900 mL) was added to the obtained organic layer, and the solution was cooled to 5° C., stirred for 30 minutes, and then filtered, thereby obtaining 209 g of a white solid compound (L1-2) (yield of 65%).

$^1$H-NMR (solvent: CDCl$_3$) δ (ppm): 3.67-3.78 (m, 6H), 3.87-3.92 (m, 2H), 4.18-4.23 (m, 2H), 4.31-4.35 (m, 2H), 5.80-5.85 (m, 1H), 6.11-6.19 (m, 1H), 6.40-6.46 (m, 1H), 6.93-6.98 (m, 2H), 8.02-8.07 (m, 2H)

(Synthesis of Compound L1-3)

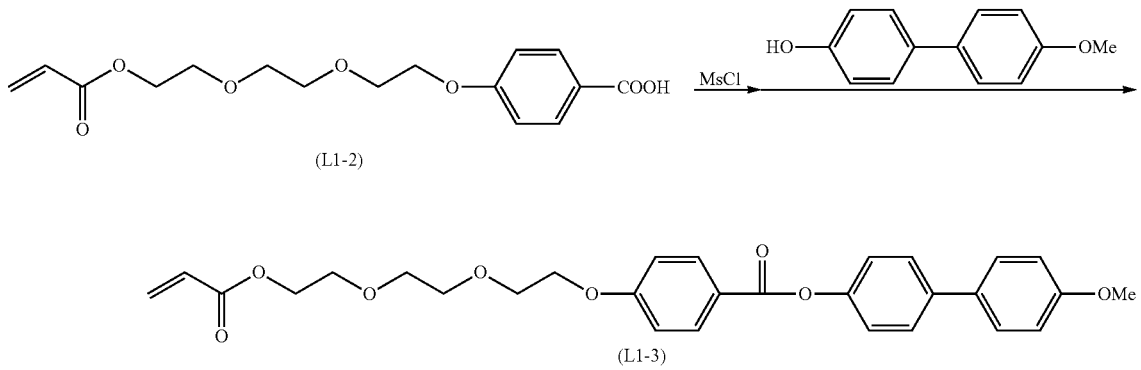

Dibutylhydroxytoluene (BHT) (200 mg) was added to a solution of methanesulfonyl chloride (MsCl) (73.4 mmol, 5.7 mL) in tetrahydrofuran (THF) (70 mL), and the internal temperature thereof was lowered to −5° C. A THF solution of the compound (L1-2) (66.7 mmol, 21.6 g) and diisopropylethylamine (DIPEA) (75.6 mmol, 13.0 mL) was added dropwise thereto such that the internal temperature thereof did not rise above 0° C. or higher. The solution was stirred at −5° C. for 30 minutes, N,N-dimethyl-4-aminopyridine (DMAP) (200 mg) was added thereto, and a solution of diisopropylethylamine (75.6 mmol, 13.0 mL) and 4-hydroxy-4'-methoxy biphenyl (60.6 mmol, 12.1 g) in tetrahydrofuran (THF) and dimethylacetamide (DMAc) was added dropwise thereto such that the internal temperature thereof did not rise above 0° C. or higher. Thereafter, the solution was stirred at room temperature for 4 hours. The reaction was stopped by adding methanol (5 mL) to the solution, water and ethyl acetate were added thereto. The solvent was removed from the organic layer extracted with ethyl acetate using a rotary evaporator, and the organic layer was purified by column chromatography using ethyl acetate and hexane, thereby obtaining 18.7 g (yield of 61%) of a compound (L1-3) as a white solid. In the structural formula, Me represents a methyl group.

$^1$H-NMR (solvent: CDCl$_3$) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (dd, 1H), 6.90-7.05 (m, 4H), 7.20-7.30 (m, 2H), 7.45-7.65 (m, 4H), 8.10-8.20 (m, 2H)

The following compound (L1-b) was contained as an impurity.

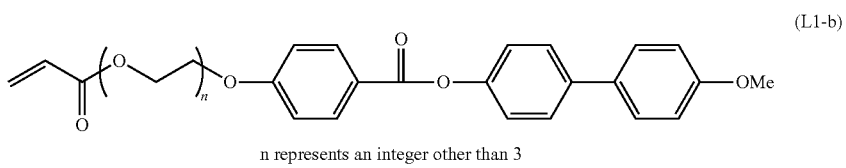
(L1-b)

n represents an integer other than 3

(Synthesis of Compound L1-23)

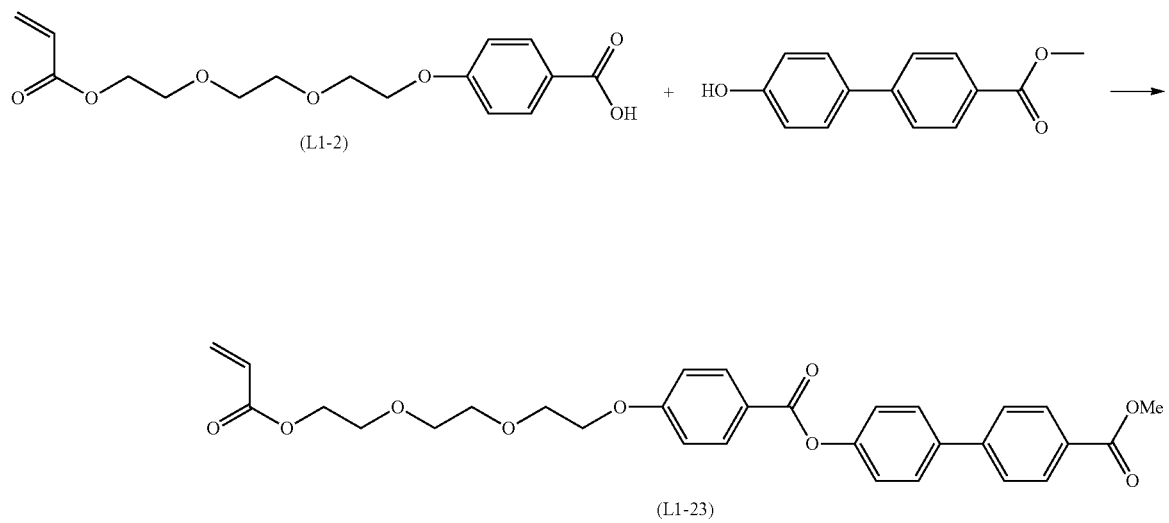

Methyl 4-(4-hydroxyphenyl) benzoate was synthesized according to the method described in Journal of Polymer Science, Part A: Polymer Chemistry, 2012, vol. 50, p. 3936 to 3943.

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (L1-2) (52.6 mmol, 17.1 g) synthesized in the above-described manner and diisopropylethylamine (DIPEA) (57.0 mol, 7.36 g) was added dropwise thereto such that the internal temperature thereof did not rise above 0° C. or higher. After the solution was stirred at −5° C. for 30 minutes, a solution of methyl 4-(4-hydroxyphenyl) benzoate (43.8 mmol, 10.0 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 20.4 g (yield of 87%) of a compound (L1-23) as a white solid.

$^1$H-NMR (solvent: CDCl$_3$) δ (ppm): 3.68-3.80 (m, 6H), 3.87-3.95 (m, 2H), 3.95 (s, 3H), 4.20-4.27 (m, 2H), 4.31-4.37 (m, 21), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

The following compound (L1-b2) was contained as an impurity.

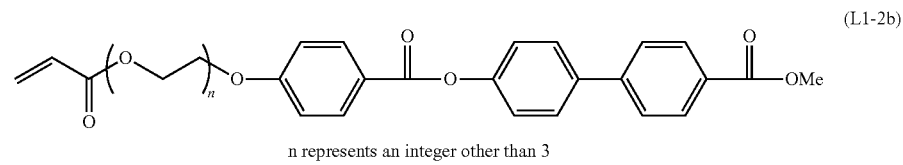
(L1-2b)

n represents an integer other than 3

(Synthesis of Liquid Crystal Compound L1)

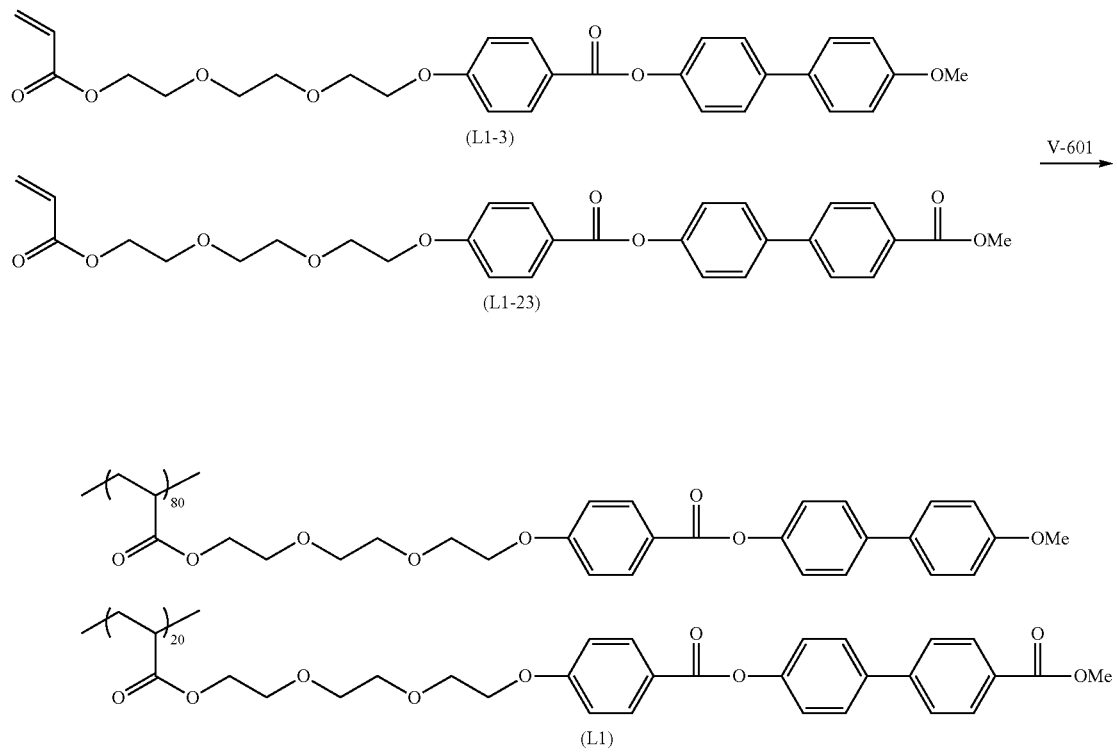

The compound (L1-3) (84 g), the compound (L1-23) (21 g), and dibutylhydroxytoluene (BHT) (158 mg) were dissolved in anisole (337 g). Dimethyl 2,2'-azobis(2-methylpropionate) (1660 mg) (trade name: "V-601") was added thereto at room temperature, and the solution was stirred. The obtained anisole solution was added dropwise to anisole (84 g) heated to 80° C. in a nitrogen atmosphere for 2 hours, and the resulting solution was stirred at 80° C. for 4 hours after the completion of the dropwise addition. The obtained reaction solution was added dropwise to methanol (1080 mL), and the precipitate was collected by a filtration operation, and the residue was washed with acetonitrile, thereby obtaining 100 g (yield of 95%) of a white solid compound (L1). The weight-average molecular weight (Mw) of the obtained polymer was 13300.

Further, the molecular weight was calculated by gel permeation chromatography (GPC) in terms of polystyrene, three of TOSOH TSKgel Super AWM-H (manufactured by Tosoh Corporation) were connected to each other and used as columns, and N-methylpyrrolidone was used as a solvent.

<Liquid Crystal Compound L2>

A liquid crystal compound L2 was synthesized according to the following steps 1 to 3.

(Step 1)

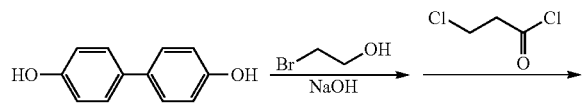

-continued

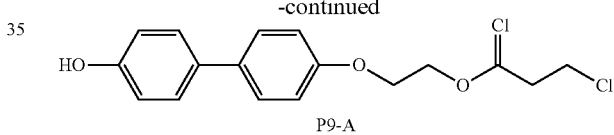

Sodium hydroxide (34.2 g) was dissolved in 1 L of water, and 4,4'-dihydroxybiphenyl (40.6 g) and bromoethanol (37.2 g) were added thereto in a nitrogen atmosphere, and the solution was stirred at 95° C. for 10 hours.

Thereafter, the solution was cooled to room temperature, concentrated hydrochloric acid was added thereto so that the reaction system was adjusted to be acidic, and the resulting solution was filtered and dried, thereby obtaining a compound P9-A as a white solid.

The obtained white solid was dissolved in 400 mL of dimethylacetamide (DMAc), 3-chloropropionyl chloride (62.0 g) was added dropwise thereto under ice-cooling, and the solution was stirred for 5 hours. Methanol (40 mL) was added thereto to stop the reaction, and water and ethyl acetate were added thereto.

The solvent was removed from the organic layer washed by performing the liquid separation operation using a rotary evaporator, and chloroform was added to the obtained concentrate. The precipitated solid was removed by filtration, the solvent was removed using a rotary evaporator, and the residue was purified by column chromatography using ethyl acetate/chloroform, thereby obtaining 20.3 g (yield of 29%) of a compound P9-A as a white solid.

$^1$H-NMR (solvent: DMSO-$d_6$) δ (ppm): 2.80-2.90 (t, 2H), 3.75-3.85 (t, 2H), 4.15-4.25 (m, 2H), 4.35-4.45 (m, 2H), 6.75-6.85 (m, 2H), 6.90-7.00 (m, 2H), 7.30-7.50. (m, 4H), 9.40 (brs, 1H)

(Step 2)

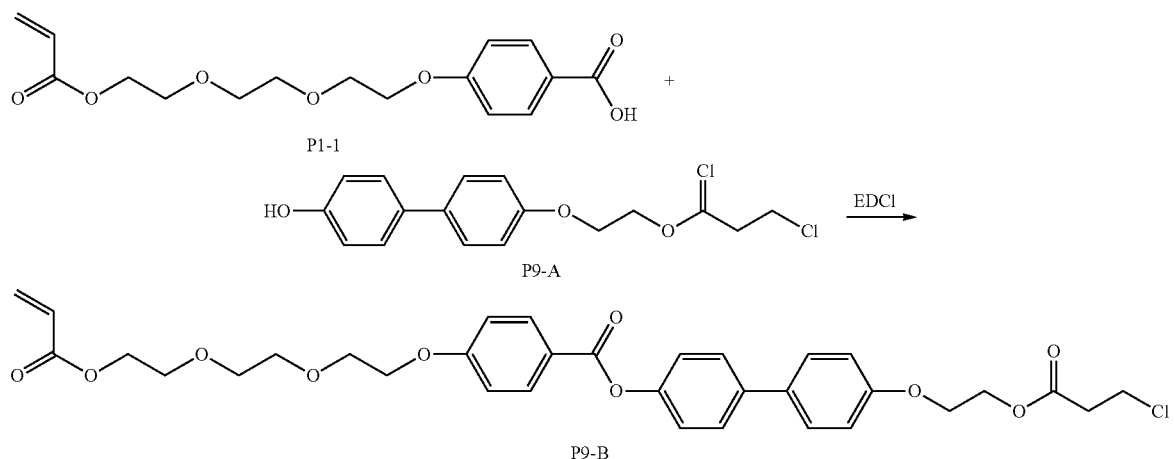

4.0 g of the compound P9-A, 8.08 g of the compound P1-1 prepared in Synthesis Example 1, and 100 mL of dichloromethane were mixed, and the mixture was stirred at room temperature. 152 mg of N,N-dimethylaminopyridine and 9.56 g of 1-(3-dimethylaminopropyl)-3-ethylcarbodiimide hydrochloride (EDCI) were added to the mixture, and the mixture was stirred at room temperature for 12 hours.

Thereafter, the solvent was removed using a rotary evaporator, and 120 mL of methanol and 120 mL of 1 M aqueous hydrochloric acid were added thereto to perform filtration, thereby obtaining a white solid. The obtained white solid was subjected to liquid separation by adding ethyl acetate and water thereto, and the collected organic layer was washed with 1 N aqueous hydrochloric acid and saturated saline and then dried over anhydrous sodium sulfate. The sodium sulfate was separated by filtration, the solvent was removed using a rotary evaporator, and the residue was purified by silica gel chromatography, thereby obtaining 5.4 g (yield of 69%) of a compound P9-B.

$^1$H-NMR (solvent: CDCl$_3$) δ (ppm): 2.87 (t, 2H), 3.68-3.82 (m, 8H), 3.90 (t, 2H), 4.18-4.28 (m, 4H), 4.28-4.38 (m, 2H), 4.46-4.54 (m, 2H), 5.84 (dd, 1H), 6.16 (dd, 1H), 6.43 (dd, 1H), 6.90-7.05 (m, 4H), 7.20-7.30 (m, 2H), 7.48-7.65 (m, 4H), 8.10-8.20 (m, 2H)

(Step 3)

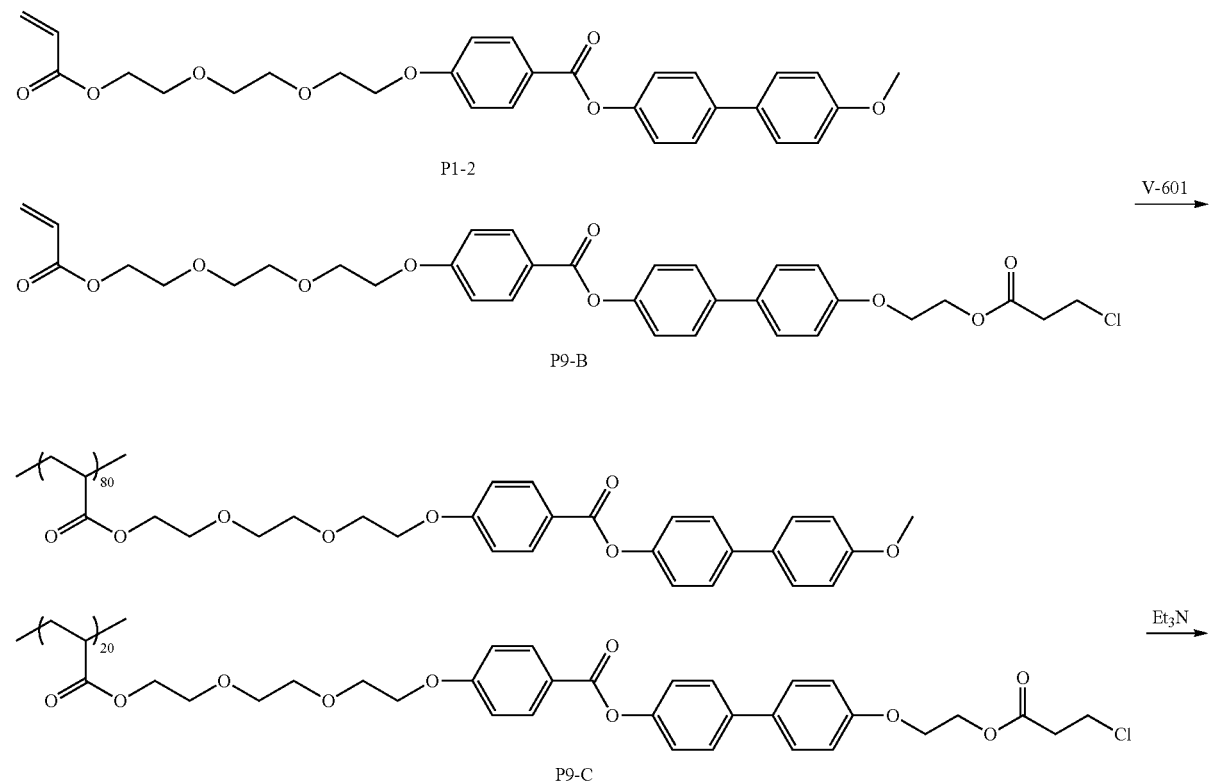

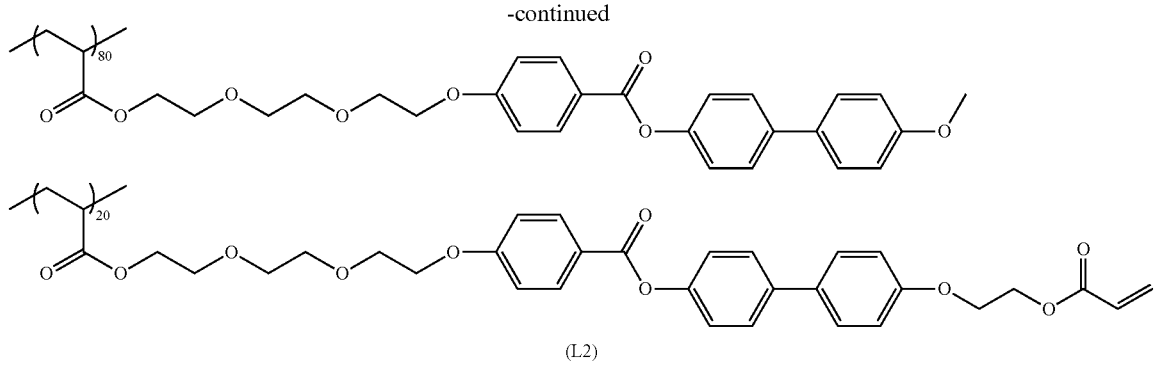

(L2)

A DMAc solution (3.3 mL) of the compound P1-2 (0.8 g) and the compound P9-B (0.2 g) was heated until the internal temperature thereof reached 80° C. under a nitrogen stream. A solution of dimethyl 2,2'-azobis(2-methylpropionate) (0.054 mmol, 0.012 g) in DMAc (0.5 mL) was added thereto, and the solution was stirred at 80° C. for 2 hours. Thereafter, elimination of the polymerizable group was confirmed by $^1$H-NMR spectrum measurement, and the solution was cooled to room temperature. Methanol was added thereto to perform filtration, and the residue was washed with methanol, thereby obtaining 0.90 g of a compound P9-C as a white solid. Dibutylhydroxytoluene (BHT) (50 mg) and triethylamine (0.7 mL) were added to a chloroform solution (7 mL) of the obtained compound P9-C, and the internal temperature was heated to 50° C. The solution was stirred at 50° C. for 9 hours, elimination of the raw materials was confirmed by $^1$H-NMR spectrum measurement, and the solution was cooled to room temperature. Methanol was added thereto to perform filtration, and the residue was washed with methanol, thereby obtaining 0.8 g of a liquid crystal compound L2 as a white solid. As a result of analysis performed on the obtained polymer liquid crystal compound L5 by gel permeation chromatography (GPC), the weight-average molecular weight (Mw) thereof was 17000 (in terms of polystyrene).

<Liquid Crystal Compound L3>

A liquid crystal compound L3 was synthesized according to the following steps 1 to 3.

<Step 1>

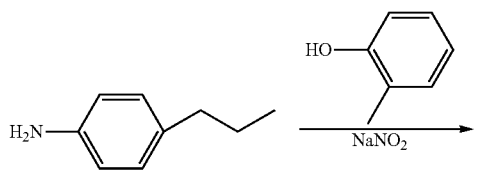

-continued

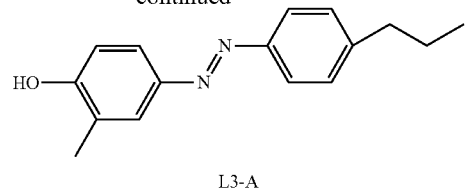

L3-A 20 g of 4-propylaniline was dissolved in 37 mL of concentrated hydrochloric acid and 300 mL of water, and the solution was stirred at an external temperature of 0° C. for 30 minutes. A solution prepared by dissolving 10.4 g of sodium nitrite in 80 mL of water was added dropwise while the internal temperature was maintained at 10° C. or lower at an external temperature of 0° C. The solution was stirred at an internal temperature of 10° C. or lower for 20 minutes to prepare a diazonium solution.

Further, 18.6 g of sodium hydroxide was dissolved in 500 mL of water, 16.2 g of o-methylphenol was added dropwise thereto, and the solution was stirred at an external temperature of 0° C. for 10 minutes to prepare a coupler solution.

Next, the diazonium solution prepared in the above-described manner was added dropwise to the prepared coupler solution while the internal temperature was maintained at 10° C. or lower. After the completion of the dropwise addition, the solution was stirred at room temperature for 1 hour.

Next, the solution was neutralized with dilute hydrochloric acid until the pH thereof was set to be in a range of 8 to 9, and the solid was allowed to be precipitated. The precipitated solid was separated by filtration, washed with water, and dried at 40° C., thereby obtaining 33 g of a yellow solid L3-A.

<Step 2>

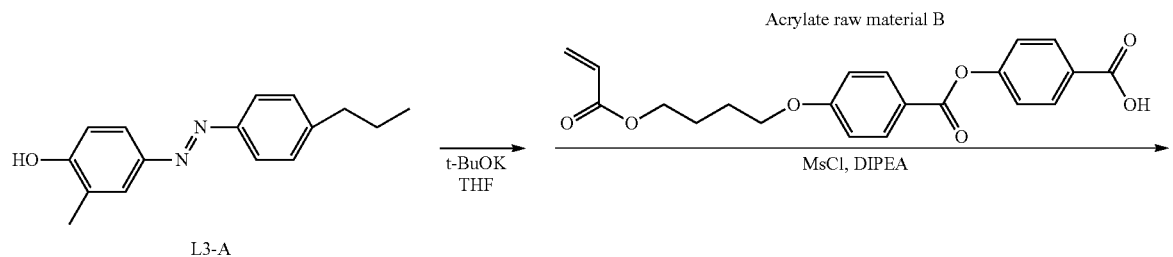

-continued

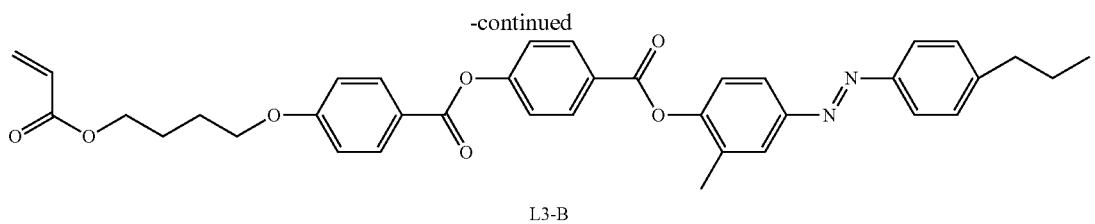
L3-B 35 g of an acrylate raw material B was allowed to be dissolved in 400 mL of tetrahydrofuran (THF), and 10.66 g of methanesulfonyl chloride was added thereto. The solution was stirred at an external temperature of 0° C. for 5 minutes, the internal temperature was maintained at 10° C. or lower, and 12.03 g of diisopropylethylamine was added dropwise thereto. The solution was stirred at an internal temperature of 10° C. or lower for 30 minutes to prepare an acrylate raw material solution.

Next, 11.36 g of t-butoxy potassium and 200 mL of THF were stirred at an external temperature of 0° C., the internal temperature was maintained at 10° C. or lower, and a solution obtained by dissolving 19.88 g of the yellow solid L3-A in 200 mL of THF was added dropwise thereto. The reaction solution was stirred at room temperature for 1 hour, and 100 mL of methanol and 1000 mL of water were added for crystallization. The obtained solid was dissolved in 500 mL of ethyl acetate at an external temperature of 80° C., 550 mL of n-hexane was added thereto, and the temperature was lowered to room temperature to precipitate a solid. The obtained solid was washed with n-hexane and dried at room temperature, thereby obtaining 31 g of a yellow solid L3-B.

<Step 3>

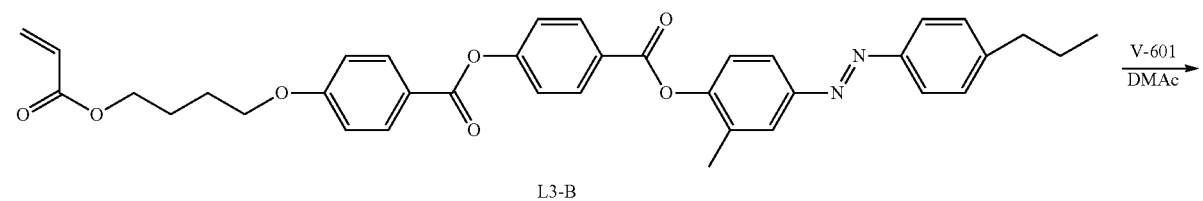
L3-B

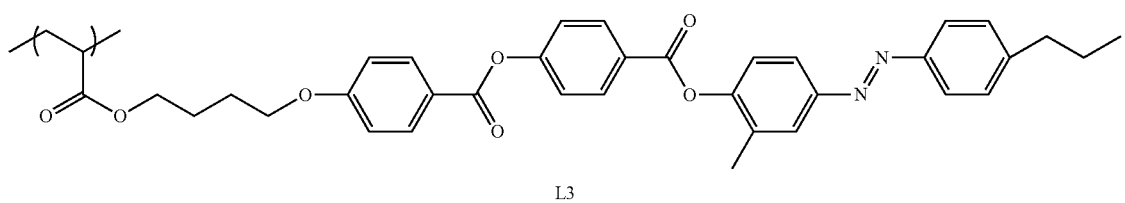
L3

30 g of the yellow solid L3-B was dissolved in 120 ml of dimethylacetamide, and the solution was stirred for 1 hour while nitrogen was allowed to be circulated. The solution was heated at an external temperature of 90° C., 0.60 g of a polymerization initiator V-601 was added to 10 mL of a dimethylacetamide solution, and the resulting solution was heated for 2 hours. The addition of the polymerization initiator and the heating of the solution at an external temperature of 90° C. for 2 hours were repeated twice to polymerize the yellow solid P2-B. After the completion of the reaction, the solution was heated at 100° C. for 2 hours. Thereafter, the internal temperature was lowered to 60° C., 150 mL of ethyl acetate was added thereto, and the solution was added dropwise to 2000 mL of methanol, and the polymer solid was allowed to be precipitated. The polymer solid which had been separated by filtration was washed with methanol and dried at room temperature, thereby obtaining 29 g of a polymer compound P3 as a yellow solid. As a result of analysis performed on the obtained liquid crystal compound L3 by gel permeation chromatography (GPC), the number average molecular weight (Mn) thereof was 6600, and the weight-average molecular weight (Mw) thereof was 14000 (in terms of polystyrene).

<Liquid Crystal Compound L4>

A liquid crystal compound L4 was synthesized according to the following Steps 1 and 2.

<Step 1>

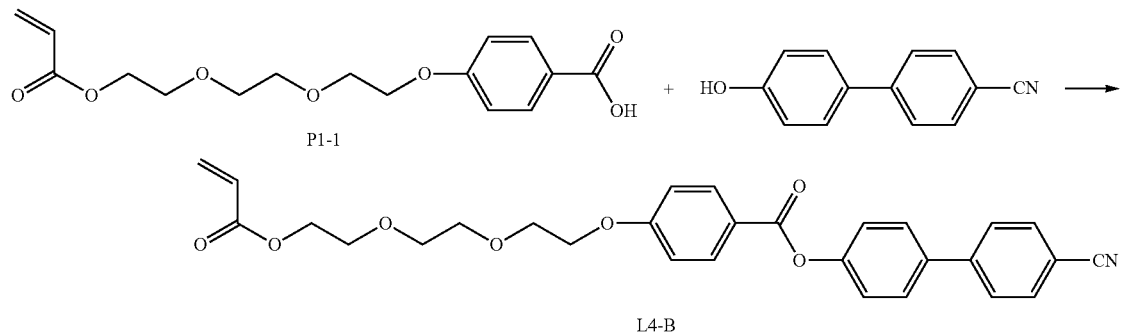

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (P-1) (52.6 mmol, 17.1 g) and diisopropylethylamine (DIPEA) (57.0 mol, 7.36 g) was added dropwise thereto such that the internal temperature thereof did not rise above 0° C. or higher. The solution was stirred at −5° C. for 30 minutes, a solution of 4-cyano-4'-hydroxybiphenyl (43.8 mmol, 8.55 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 19.0 g (yield of 87%) of a compound (L4-B) as a white solid.

$^1$H-NMR (solvent: CDCl$_3$) δ (ppm): 3.68-3.80 (m, 6H), 3.87-3.95 (m, 2H), 4.20-4.27 (m, 2H), 4.32-4.37 (m, 2H), 5.84 (dd, 1H), 6.16 (dd, 1H), 6.43 (dd, 1H), 6.98-7.05 (m, 2H), 7.30-7.37 (m, 2H), 7.60-7.78 (m, 6H), 8.13-8.20 (m, 2H)

<Step 2>

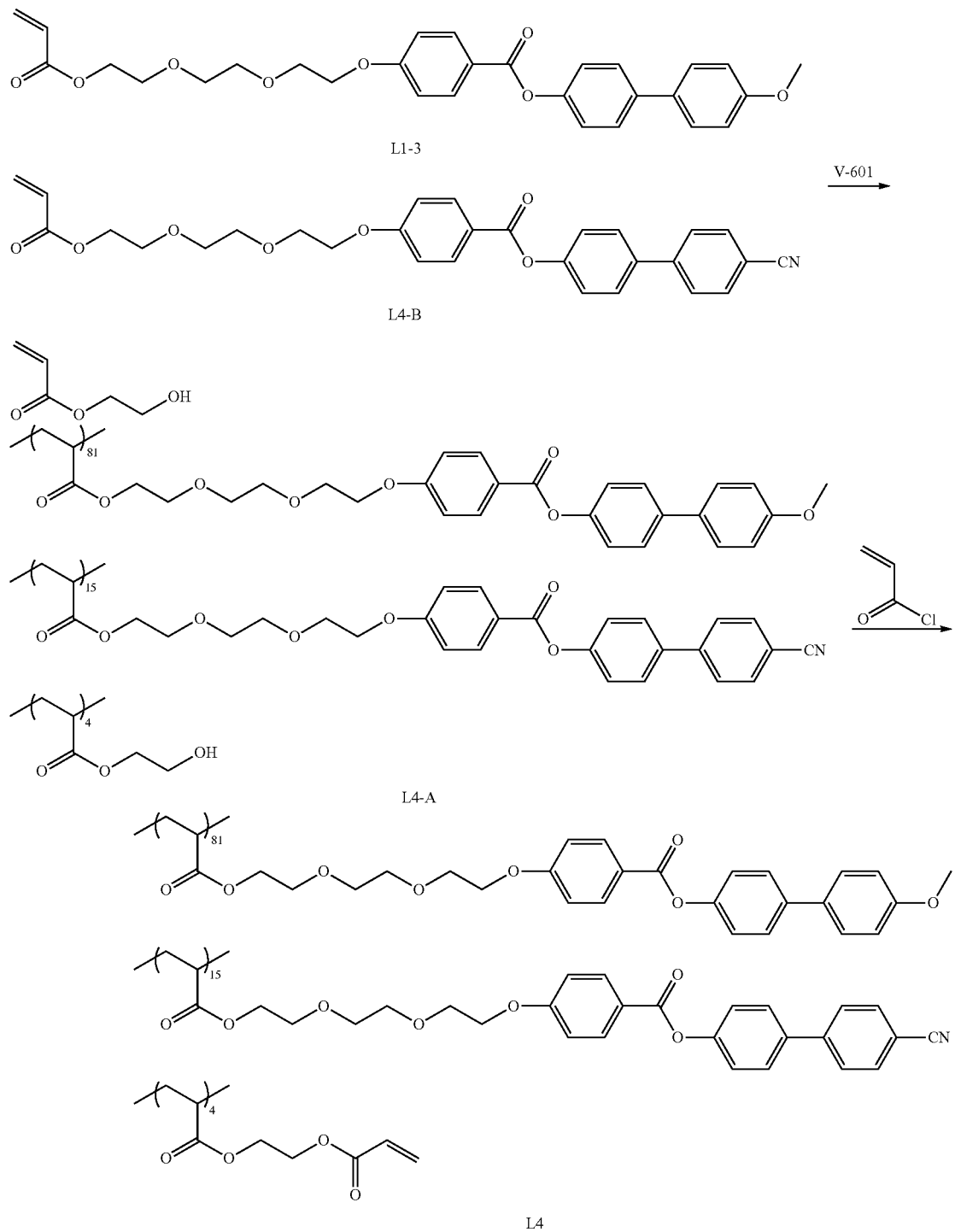

A DMAc solution (3.3 mL) of the compound L1-3 (0.81 g), the compound L4-B (0.15 g), and 2-hydroxyethyl acrylate (0.04 g) was heated until the internal temperature thereof reached 80° C. under a nitrogen stream. A DMAc solution (0.5 mL) of dimethyl 2,2'-azobis(2-methylpropionate) (0.54 mmol, 0.12 g) (trade name "V-601", manufactured by FUJIFILM Wako Pure Chemical Corporation) was added thereto, and the solution was stirred at 80° C. for 2 hours. Thereafter, elimination of the polymerizable group was confirmed by $^1$H-NMR spectrum measurement, and the solution was cooled to room temperature. Methanol was added and the mixture was filtered, and the residue was washed with methanol, thereby obtaining 0.98 g of a compound (L4-A) as a white solid.

Next, the compound (L4-A) was dissolved in 10 mL of dimethylacetamide (DMAc), acrylic acid chloride (0.2 g)

was added dropwise thereto under ice-cooling, and the mixture was stirred for 5 hours. Methanol was added thereto, the solution was filtered, and the residue was washed with methanol, thereby obtaining 0.96 g of a liquid crystal compound L4.

As a result of analysis of the obtained liquid crystal compound L4 by gel permeation chromatography (GPC), the weight-average molecular weight (Mw) thereof was 15000 (in terms of polystyrene).

Example 1

<Preparation of Transparent Support 1>

A TAC base material (product name, "TG40", manufactured by FUJIFILM Corporation) having a thickness of 40 μm was continuously coated with an alignment film coating solution having the following composition using a #8 wire bar. Thereafter, the base material was dried with warm air at 100° C. for 2 minutes, thereby obtaining a transparent support 1 in which a polyvinyl alcohol (PVA) alignment film having a thickness of 0.8 μm was formed on the TAC base material.

Further, modified polyvinyl alcohol was added to the alignment film coating solution such that the concentration of solid contents was set to 4% by mass.

Composition of Alignment Film Coating Solution
Modified vinyl alcohol (PVA-1 shown below): 2.00 parts by mass
Water: 74.08 parts by mass
Methanol: 23.86 parts by mass
Polymerization initiator (IRGACURE 2959, manufactured by BASF SE): 0.06 parts by mass
Modified Polyvinyl Alcohol (PVA-1)

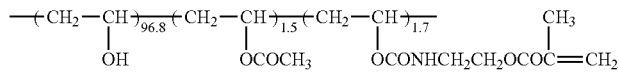

<Preparation of Alignment Film 1>

41.6 parts by mass of butoxyethanol, 41.6 parts by mass of dipropylene glycol monomethyl ether, and 15.8 parts by mass of pure water were added to 1 part by mass of a photo-alignment material E-1 having the following structure, and the obtained solution was filtered using a 0.45 μm membrane filter under pressure, thereby preparing a composition 1 for forming an alignment film.

Thereafter, the transparent support 1 was coated with the obtained composition 1 for forming an alignment film and dried at 60° C. for 1 minute. Next, the obtained coating film was irradiated with linearly polarized ultraviolet rays (illuminance of 4.5 mW, irradiation dose of 500 mJ/cm²) using a polarized ultraviolet ray exposure device, thereby preparing an alignment film 1 (noted as azo (E-1) in Table 1).

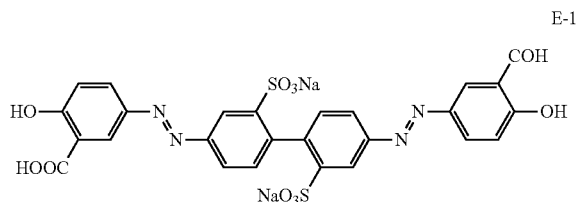

E-1

<Preparation of Polarizer 1>

The obtained alignment film 1 was continuously coated with the following polarizer-forming composition 1 using a #7 wire bar to form a coating film 1.

Next, the coating film 1 was heated at 140° C. for 90 seconds, and the coating film 1 was cooled to room temperature (23° C.).

Next, the coating film 1 was heated at 90° C. for 60 seconds and cooled to room temperature again.

Thereafter, the coating film 1 was irradiated under an irradiation condition of an illuminance of 28 mW/cm² for 60 seconds using a high-pressure mercury lamp, thereby preparing a polarizer 1 on the alignment film 1.

Composition of Polarizer-Forming Composition 1
First dichroic material Y1 shown below: 0.140 parts by mass
Second dichroic material C1 shown below: 0.608 parts by mass
Third dichroic material M1 shown below: 0.225 parts by mass
Liquid crystal compound L1 shown below: 4.389 parts by mass
Additive LC1 shown below: 0.549 parts by mass
Interface modifier F1 shown below: 0.043 parts by mass
Polymerization initiator I1 (IRGACURE 819, manufactured by BASF SE): 0.047 parts by mass
Cyclopentanone: 47.000 parts by mass
Tetrahydrofuran: 47.000 parts by mass <X-Ray Diffraction Spectrum>

In the obtained polarizer 1, the surface of the polarizer layer was irradiated with X-rays under the following conditions using an X-ray diffractometer for evaluating a thin film (trade name: "SmartLab" manufactured by Rigaku Corporation) to perform in-plane XRD.

(Conditions)
Cu ray source to be used (CuKα, output of 45 kV, 200 mA)
X-ray incidence angle of 0.2°
Optical system to be used: parallel optical system (CBO (PB))
Incident side, incident slit having a width of 0.2 mm, incident parallel slit in-plane PSC at 0.5 deg, longitudinal limit slit having a width of 10 mm
Light-receiving side, light-receiving slit having a width of 20 mm, light-receiving parallel slit in-plane PSA at 0.5 deg
Detector: HyPix3000 (OD mode) manufactured by Rigaku Corporation
2θχ/φ Scan, scan conditions: 0.008 degrees/step, 2.0 degrees/min in a range of 1 to 40 degrees
φ (Scan, scan conditions: 0.5 degree/step, 9.6 degree/min in a range of −120 to 120 degrees The direction in which the liquid crystal compound and the dichroic material were aligned in the major axis direction was set as an azimuthal angle (φ) of 0°, in-plane XRD (2χ/φ scan) was performed in all directions for every 15°, and the orientation in the substrate plane where the peak intensity was the maximum was determined based on φ scan performed on the observed peak. Both measurements were performed using CuKα at an incidence angle of 0.20°. The period length of the peak obtained by the measurement in the alignment axis direction (the orientation determined as described above) was acquired from the relationship between the diffraction angle and the distance using the film of the measurement sample. The value was standardized as a film thickness corresponding to the X-ray penetration length at an X-ray incidence angle of 0.2°, and the peak intensity was calculated (cps notation).

$d=\lambda/(2\times\sin\theta)$ ($d$:distance, $\lambda$:incident X-ray wavelength(CuKα;1.5418Å))

The results are shown in FIG. 1.

As shown in FIG. 1, three peaks a1 to a3 were observed in a diffraction angle range of 17° or less. Further, d corresponding to the peak a1 was 30.3 Å, d corresponding to the peak a2 was 18.3 Å, and d corresponding to the peak a3 was 11.2 Å.

The distances d corresponding to each of the peaks a1 to a3 do not have an integer multiple relationship with each other. Therefore, all the peaks a1 to a3 correspond to the peak A.

Further, a broad peak b (halo) was observed at a position where the diffraction angle was approximately 20°.

<Formation of Transparent Resin Layer (Barrier Layer) 1>

The polarizer 1 was continuously coated with the following curable composition 1 using a #2 wire bar and dried at 60° C. for 5 minutes.

Next, the polarizer 1 was irradiated under an irradiation condition of an illuminance of 28 mW/cm² for 60 seconds using a high-pressure mercury lamp so that the curable composition 1 was cured, thereby preparing a laminate in which a transparent resin layer (barrier layer) 1 was formed on the polarizer 1. In this manner, a laminate of Example 1 was obtained.

The cross section of the transparent resin layer 1 was cut using a microtome cutting machine, and the film thickness thereof was measured by observation with a scanning electron microscope (SEM), and the film thickness was approximately 1.0 μm.

Curable Composition 1

Polymerizable compound KAYARAD PET-30 (manufactured by Nippon Kayaku Co., Ltd.): 29 parts by mass Polymerization initiator IRGACURE 819 (manufactured by BASF SE): 1 part by mass Alumina ethanol sol A2K5-10 (manufactured by Kawaken Fine Chemicals Co., Ltd., colloid liquid obtained by dispersing columnar alumina hydrate particles in liquid): 70 parts by mass

KAYARAD PET-30

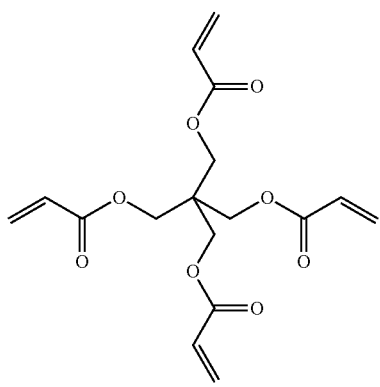

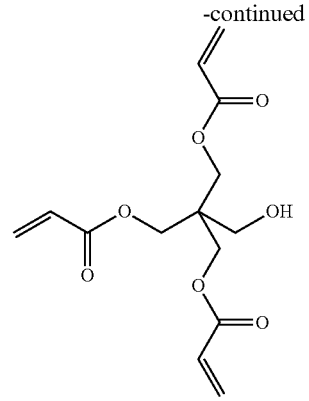

Examples 2 to 5 and Comparative Examples 1 and 2

Each polarizer and each laminate including the polarizer were prepared according to the same procedure as in Example 1 except that the polarizer-forming composition with the composition listed in Table 1 was used in place of the polarizer-forming composition 1.

In addition, in Examples 2 to 5 and Comparative Examples 1 and 2, in-plane XRD was performed in the same manner as in Example 1 after preparation of the polarizer. As the result, in Examples 2 to 5, a peak A in which the interval of the periodic structure did not have an integer multiple relationship with the interval of the periodic structure corresponding to another peak was observed in a diffraction angle range of 17° or less.

Figure 2:
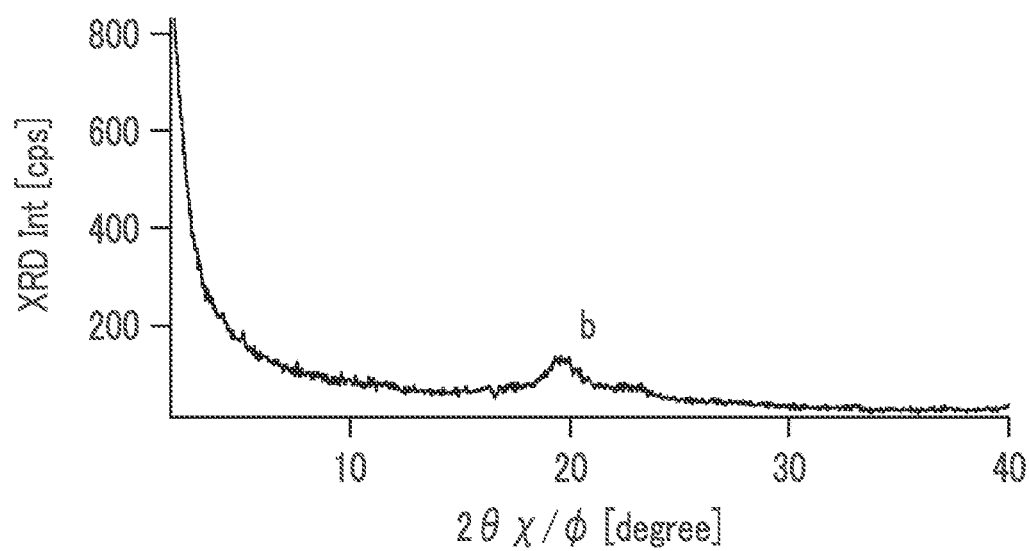
FIG. 2 is a graph showing an XRD spectrum corresponding to a polarizer of Comparative Example 1.

Meanwhile, FIG. 2 shows the XRD spectrum of Comparative Example 1. As shown in FIG. 2, in the XRD spectrum, peaks are not present in a diffraction angle range of 17° or less. That is, the peak A was not observed.

Further, FIG. 3 shows the XRD spectrum of Comparative Example 2. As shown in FIG. 3, in the XRD spectrum, two peaks are present in a diffraction angle range of 17° or less. The intervals of the periodic structures corresponding to the two peaks are respectively 35.9 Å and 17.6 Å, which have an integer multiple (twice) relationship with each other. The polarizer in Comparative Example 2 is a polarizer having only a smectic component.

Further, in Examples 2 to 5, φ scan was performed on the periodic structure corresponding to one of the peaks A.

FIG. 4 shows the result of φ scan for one of the peaks A observed in Example 2. The observed peak was fitted to the gauss function to determine the half-width of the peak. As the result, the value was 3°.

Figure 5:
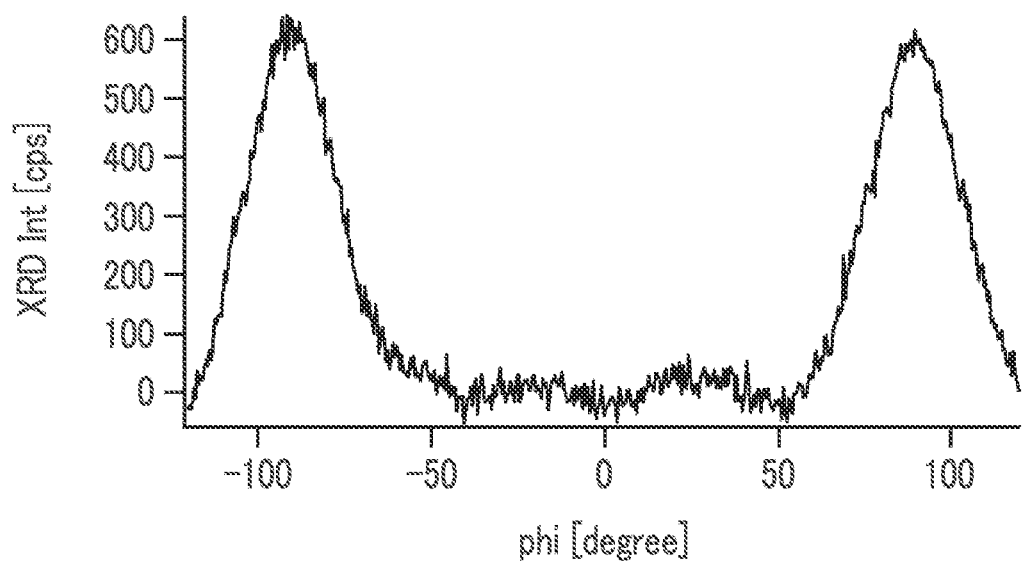
FIG. 5 is a graph showing $\varphi$ scan corresponding to a polarizer according to an embodiment of the present invention.

FIG. 5 shows the result of φ scan for one of the peaks A observed in Example 3. The half-width of the observed peak was 30°.

Figure 6:
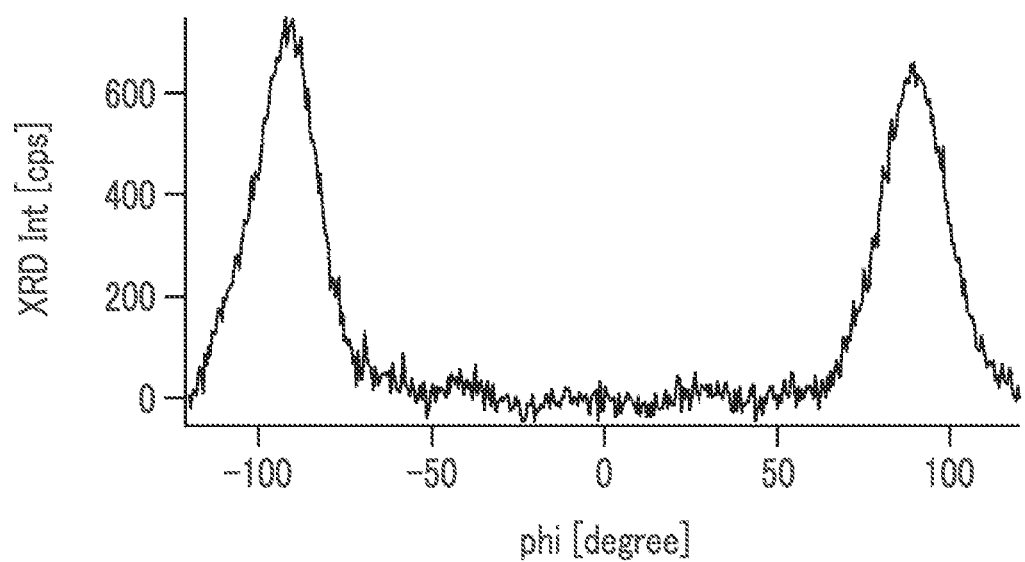
FIG. 6 is a graph showing $\varphi$ scan corresponding to a polarizer according to an embodiment of the present invention.

FIG. 6 shows the result of φ scan for one of the peaks A observed in Example 4. The half-width of the observed peak was 23°.

Figure 7:
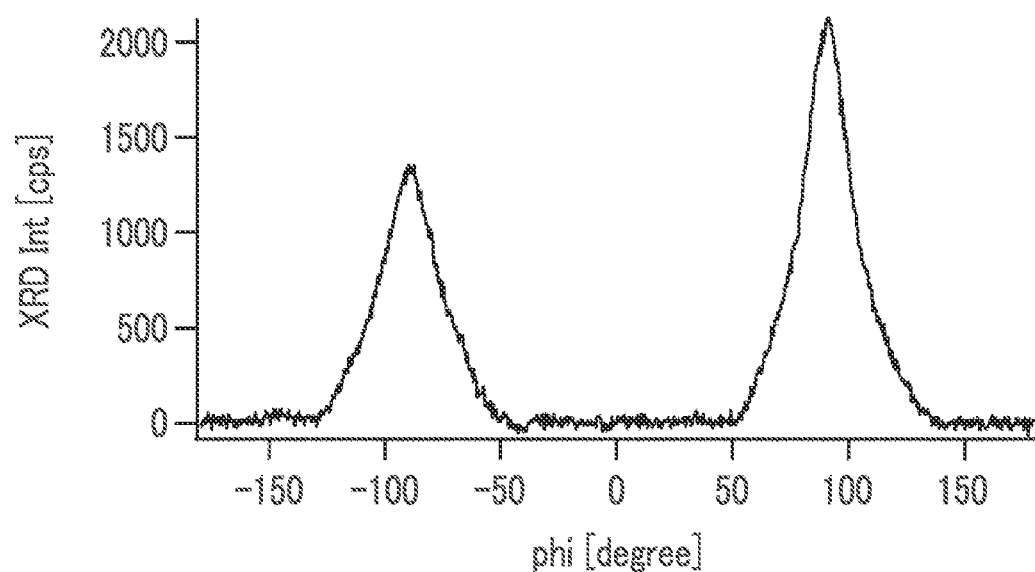
FIG. 7 is a graph showing $\varphi$ scan corresponding to a polarizer according to an embodiment of the present invention.

FIG. 7 shows the result of φ scan for one of the peaks A observed in Example 5. The half-width of the observed peak was 33°.

[Liquid Crystal Compound]

The liquid crystal compounds used in each example are collectively shown below.

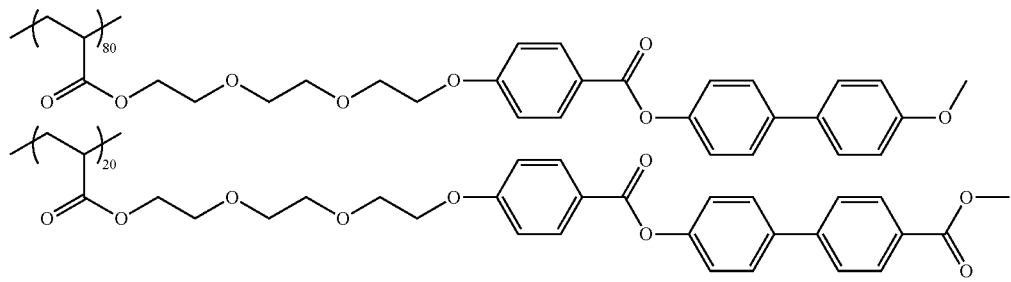

L1

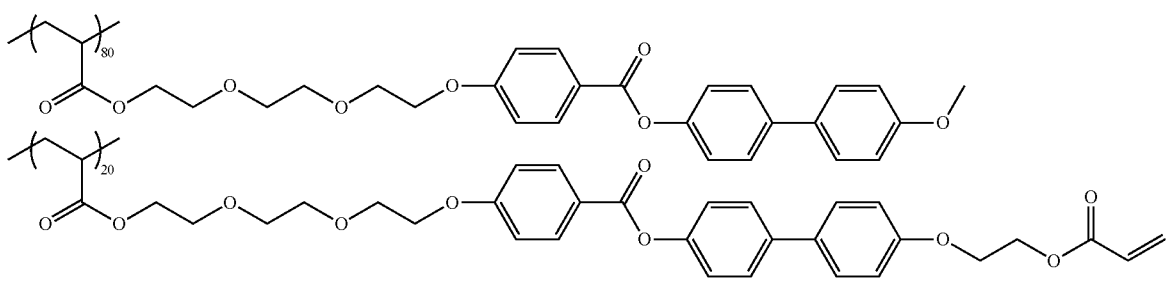

L2

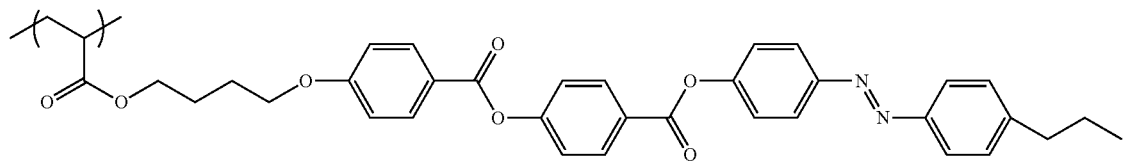

L3

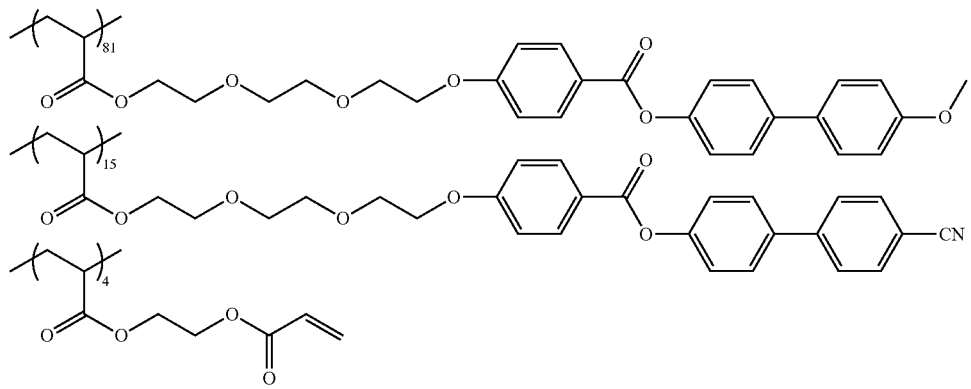

L4

[Liquid Crystal Phase Transition Temperature]

Two polarizers of an optical microscope (ECLIPSE E600 POL, manufactured by Nikon Corporation) were disposed so as to be orthogonal to each other, and a sample table was set between the two polarizers. Further, a small amount of the liquid crystal compound was placed on slide glass, and the slide glass was set on a hot stage placed on the sample table. While the state of the sample was observed with a microscope, the temperature of the hot stage was increased by 5° C./min, and the kind of the liquid crystal phase of the sample and the phase transition temperature were recorded. The results are shown below. In the description below, K represents an individual, SmA represents a smectic A phase, SmB represents a smectic B phase. SmC represents a smectic C phase, N represents a nematic phase, and Iso represents an isotropic phase. Further, ">250" means that the phase is a nematic phase (phase transition does not occur) up to 250° C.

L1: K 98° C. N 243° C. Iso
L2: K 98° C. N 240° C. iso
L3: K 117° C. N>250
L4: K 87° C. SmC 116° C. SmA 218° C. N 245° C. Iso

[Additive]

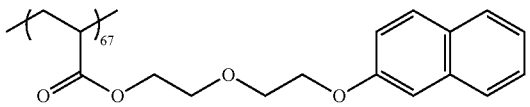

LC1

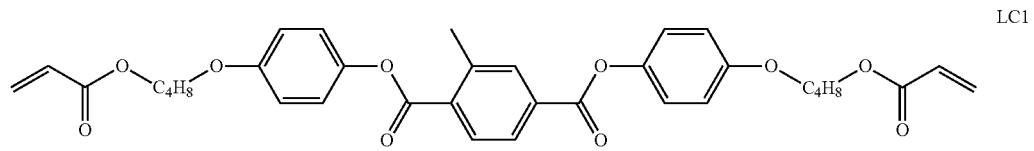

[Dichroic Material]

The dichroic materials used in each example are collectively shown below.

[Evaluation]

The degree of alignment of the laminate including the polarizer was evaluated as follows.

Y1

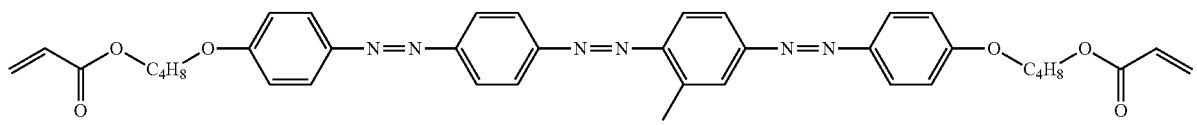

Y2

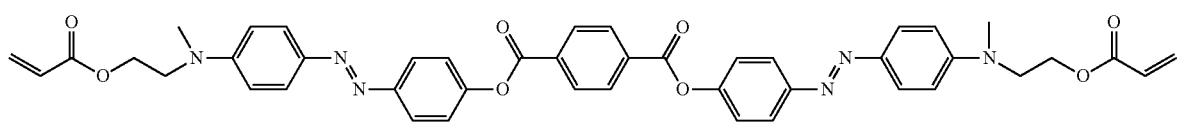

C1

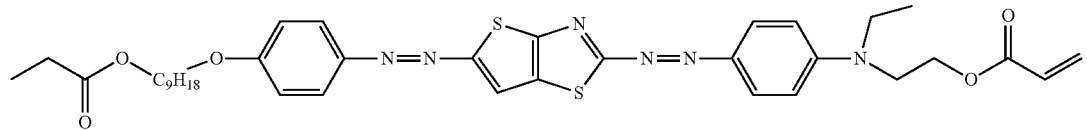

C2

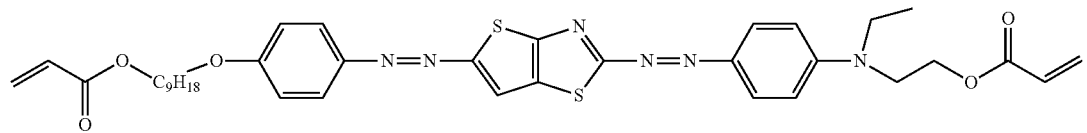

M1

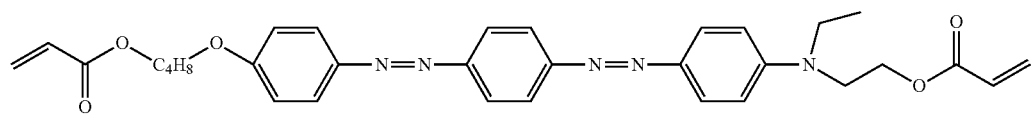

[Interface Modifier]

The interface modifiers used in each example are shown below.

[Degree of Alignment]

Each laminate of the examples and the comparative examples was set on a sample table in a state where a linear polarizer was inserted into the light source side of an optical microscope (product name "ECLIPSE E600 POL", manufactured by Nikon Corporation), and the absorbance of the polarizer in a wavelength range of 400 nm to 700 nm was measured using a multi-channel spectrometer (product name "QE65000", manufactured by Ocean Optics, Inc.). Next, a degree S of alignment was calculated according to the following equation.

Figure 8:
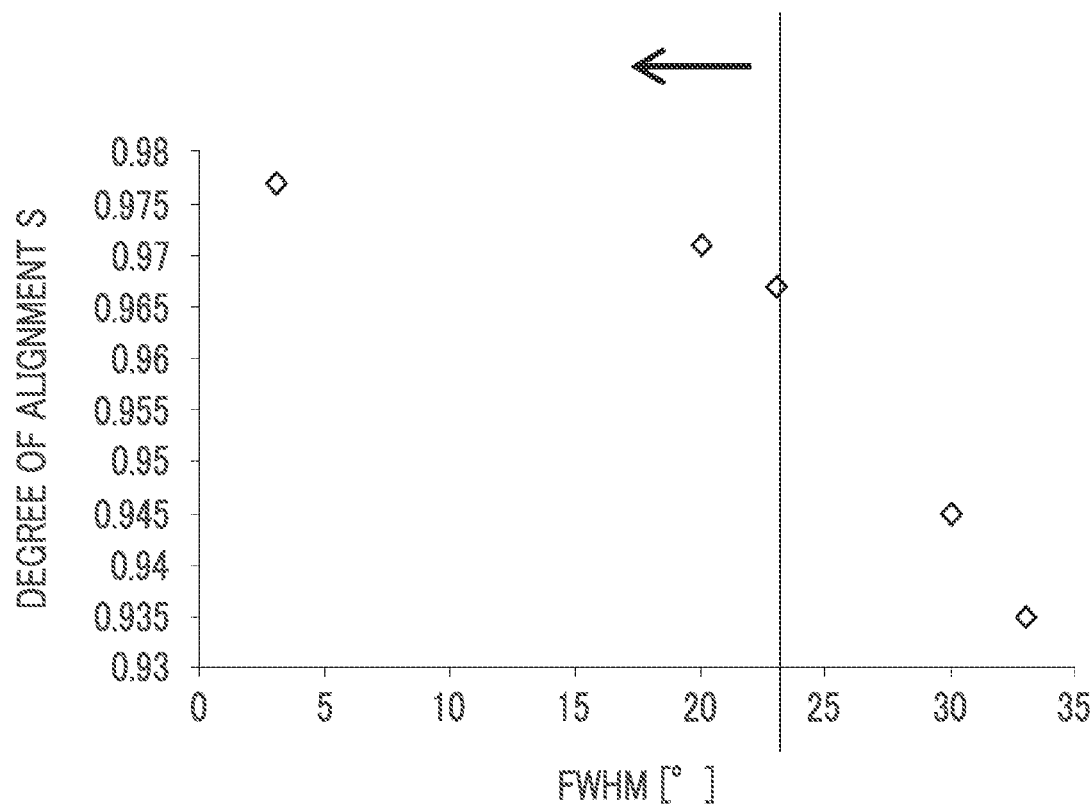
FIG. 8 is a graph showing the relationship between the half-width and the degree of alignment.

The results are listed in Table 1. Further, FIG. 8 is a graph showing the relationship between the half-width (FWHM)

F1

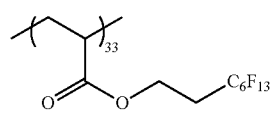

and the degree S of alignment in φ scan. Practically, the degree of alignment is preferably 0.93 or greater and more preferably 0.96 or greater.

Degree of alignment: $S=((Az0/Ay0)-1)/((Az0/Ay0)+2)$

Az0: Absorbance of polarizer with respect to polarized light in absorption axis direction Ay0: Absorbance of polarizer with respect to polarized light in polarization axis direction In the equation described above, "Az0" represents the absorbance of the polarizer with respect to polarized light in the absorption axis direction, and "Ay0" represents the absorbance of the polarizer with respect to polarized light in the polarization axis direction.

spectrum being acquired by performing in-plane XRD (2θχ/φ Scan) under the following scan conditions in an orientation in which a peak intensity is maximum in a direction orthogonal to the alignment axis direction, at least one of a plurality of peaks observed in a diffraction angle (2θχ/φ) range of 17° or less is a peak A in which an interval of a periodic structure corresponding to the at least one peak does not have an integer multiple relationship with an interval of a periodic structure corresponding to at least one of other peaks observed in the diffraction angle 2θχ/φ) range of 17° or less, with scan conditions: 0.008 degrees/step, 2.0 degrees/min in a range of 1 to 40 degrees,

TABLE 1

| | Liquid crystal compound | | First dichroic material | | Second dichroic material | | Third dichroic material | | Additive | | Interface modifier | | Polymerization initiator | | Tetrahydrofuran | Cyclopentanone | φ | Degree |
|---|---|---|---|---|---|---|---|---|---|---|---|---|---|---|---|---|---|---|
| | Type | Parts by mass | Type | Parts by mass | Type | Parts by mass | Type | Parts by mass | Type | Parts by mass | Type | Parts by mass | Type | Parts by mass | Parts by mass | Parts by mass | Scan Half-width | of alignment |
| Example 1 | L1 | 4.389 | Y1 | 0.140 | C1 | 0.608 | M1 | 0.225 | LC1 | 0.549 | F1 | 0.043 | I1 | 0.047 | 47.000 | 47.000 | 20 | 0.971 |
| Example 2 | L1 | 5.303 | Y1 | 0.198 | C1 | 0.784 | — | 0 | — | 0 | F1 | 0.055 | I1 | 0.060 | 46.800 | 46.800 | 3 | 0.977 |
| Example 3 | L1 | 4.251 | Y1 | 0.298 | C2 | 0.383 | — | 0 | — | 0 | F1 | 0.033 | I1 | 0.036 | 47.500 | 47.500 | 30 | 0.945 |
| Example 4 | L1 | 4.646 | Y1 | 0.142 | C1 | 0.607 | M1 | 0.224 | LCI | 0.492 | F1 | 0.043 | I1 | 0.046 | 46.900 | 46.900 | 23 | 0.967 |
| Example 5 | L2 | 4.031 | Y1 | 0.226 | C2 | 0.290 | — | 0 | — | 0 | F1 | 0.025 | I1 | 0.027 | 47.700 | 47.700 | 33 | 0.935 |
| Comparative Example 1 | L3 | 5.984 | Y2 | 0.419 | — | 0.000 | — | 0 | — | 0 | F1 | 0.047 | I1 | 0.051 | 46.750 | 46.750 | — | 0.85 |
| Comparative Example 2 | L4 | 4.347 | Y1 | 0.283 | C2 | 0.4 | — | 0 | — | 0 | F1 | 0.034 | I1 | 0.037 | 47.45 | 47.45 | — | 0.90 |

As listed in Table 1, in the XRD spectrum, it was found that in Examples 1 to 5 in which the peaks A having intervals of the periodic structures that did not have an integer multiple relationship with the intervals of the periodic structures corresponding to other peaks were observed in a diffraction angle range of 17° or less, the degrees of alignment were higher than those of the comparative examples.

Further, as shown in FIG. 8 (comparison between Examples 2 to 5), it was found that the half-width of the peak in φ scan for the periodic structure corresponding to the peak A is preferably 30° or less and more preferably in a range of 3 to 23°.

What is claimed is:

1. A polarizer which is formed of a polarizer-forming composition containing a liquid crystal compound and a dichroic material,
   wherein the liquid crystal compound and the dichroic material are horizontally aligned parallel to the main surface of the polarizer,
   the liquid crystal compound is a liquid crystalline compound having a nematic component mixed with a high-order crystal component after formation of the polarizer, and no dichroic property in the visible light region,
   the liquid crystalline compound is a polymer liquid crystalline compound having two kinds of repeating units represented by Formula (1), and
   in an X-ray diffraction spectrum of the polarizer, where the liquid crystal compound and the dichroic material are aligned in a major axis direction on the measuring thin film X-ray diffractometer that is parallel to the incident X-ray (alignment axis direction) and the azimuthal angle (φ) is set to 0°, the X-ray diffraction

(1)

in Formula (1), P1 represents a main chain of the repeating unit, L1 represents a single bond or a divalent linking group, SP1 represents a spacer group, M1 represents a mesogen group, and T1 represents a terminal group.

2. The polarizer according to claim 1,
   wherein the content of the dichroic material is in a range of 5 to 30 parts by mass with respect to 100 parts by mass of the liquid crystal compound.

3. The polarizer according to claim 1,
   wherein a half-width of a peak in y scan for the periodic structure corresponding to the at least one peak A is 30° or less.

4. The polarizer according to claim 1,
   wherein the half-width of the peak in φ scan for the periodic structure corresponding to the at least one peak A is in a range of 3° to 23°.

5. The polarizer according to claim 1,
   wherein the polarizer-forming composition exhibits only nematic liquid crystallinity.

6. The polarizer according to claim 1,
   wherein the peak A is observed in a direction outside of a range of ±5° of a direction orthogonal to the direction of the alignment axis along which the liquid crystal compound and the dichroic material are aligned.

7. An image display device comprising:
   the polarizer according to claim 1.

8. The polarizer according to claim 3,
wherein the half-width of the peak in φ scan for the periodic structure corresponding to the at least one peak A is in a range of 3° to 23°.

9. The polarizer according to claim 3,
wherein the polarizer-forming composition exhibits only nematic liquid crystallinity.

10. The polarizer according to claim 3,
wherein the peak A is observed in a direction outside of a range of ±5° of a direction orthogonal to the direction of the alignment axis along which the liquid crystal compound and the dichroic material are aligned.

11. An image display device comprising:
the polarizer according to claim 3.

12. The polarizer according to claim 4,
wherein the polarizer-forming composition exhibits only nematic liquid crystallinity.

13. The polarizer according to claim 4,
wherein the peak A is observed in a direction outside of a range of ±5° of a direction orthogonal to the direction of the alignment axis along which the liquid crystal compound and the dichroic material are aligned.

14. An image display device comprising:
the polarizer according to claim 4.

15. The polarizer according to claim 5,
wherein the peak A is observed in a direction outside of a range of ±5° of a direction orthogonal to the direction of the alignment axis along which the liquid crystal compound and the dichroic material are aligned.

16. An image display device comprising:
the polarizer according to claim 5.

17. An image display device comprising:
the polarizer according to claim 6.

* * * * *